United States Patent
Satoh et al.

(10) Patent No.: US 6,643,834 B2
(45) Date of Patent: Nov. 4, 2003

(54) METHOD OF AND APPARATUS FOR DESIGNING LAYOUT OF ANALOG CELLS, AND COMPUTER PRODUCT

(75) Inventors: Takao Satoh, Tokyo (JP); Takeshi Senoh, Tokyo (JP); Takashi Koyama, Tokyo (JP)

(73) Assignees: Mitsubishi Denki Kabushiki Kaisha, Tokyo (JP); Mitsubishi Electric System LSI Design Corporation, Hyogo (JP)

( * ) Notice: Subject to any disclaimer, the term of this patent is extended or adjusted under 35 U.S.C. 154(b) by 70 days.

(21) Appl. No.: 10/080,044

(22) Filed: Feb. 22, 2002

(65) Prior Publication Data

US 2003/0056186 A1 Mar. 20, 2003

(30) Foreign Application Priority Data

Sep. 14, 2001 (JP) ........................... 2001-279886

(51) Int. Cl.⁷ ................................. G06F 9/45
(52) U.S. Cl. ................. 716/10; 716/1; 716/5; 716/9; 716/11; 716/12; 716/13; 716/14
(58) Field of Search .................. 716/10, 1, 5, 9, 716/11, 12–14

(56) References Cited

U.S. PATENT DOCUMENTS

| | | | | | |
|---|---|---|---|---|---|
| 4,216,389 A | * | 8/1980 | Carter | ........................ | 307/247 |
| 5,235,566 A | * | 8/1993 | Merrill | ........................ | 368/113 |
| 5,422,317 A | * | 6/1995 | Hua et al. | .................... | 437/250 |
| 5,461,576 A | * | 10/1995 | Tsay et al. | .................. | 364/490 |
| 5,483,461 A | * | 1/1996 | Lee et al. | .................... | 364/490 |
| 5,604,680 A | * | 2/1997 | Bamji et al. | ................. | 364/491 |
| 5,801,407 A | * | 9/1998 | Yamada | ..................... | 257/207 |
| 6,058,496 A | * | 5/2000 | Gillis et al. | ................. | 714/727 |
| 6,230,304 B1 | * | 5/2001 | Groeneveld et al. | ........... | 716/7 |
| 2002/0030212 A1 | * | 3/2002 | Fujii et al. | .................. | 257/296 |

FOREIGN PATENT DOCUMENTS

| | | | | |
|---|---|---|---|---|
| JP | 5-129519 | | 5/1993 | |
| JP | 7-73217 | | 3/1995 | |
| JP | 9-306995 | | 11/1997 | |
| JP | 2000-148811 | * | 5/2000 | ........... G06F/17/50 |

* cited by examiner

*Primary Examiner*—Matthew Smith
*Assistant Examiner*—Granvill D. Lee
(74) *Attorney, Agent, or Firm*—Leydig, Voit & Mayer, Ltd.

(57) ABSTRACT

Data corresponding to an analog circuit diagram is generated and stored. Circuit connection information is extracted based on the analog circuit diagram data and stored. Devices to be paired are predicted and extracted based on the circuit connection information. The devices added as design constraints to the circuit connection information, and the result of addition is stored. Layout cells are placed on the basis of the circuit connection information including the design constraints. Routing of the layout cells is conducted.

19 Claims, 28 Drawing Sheets

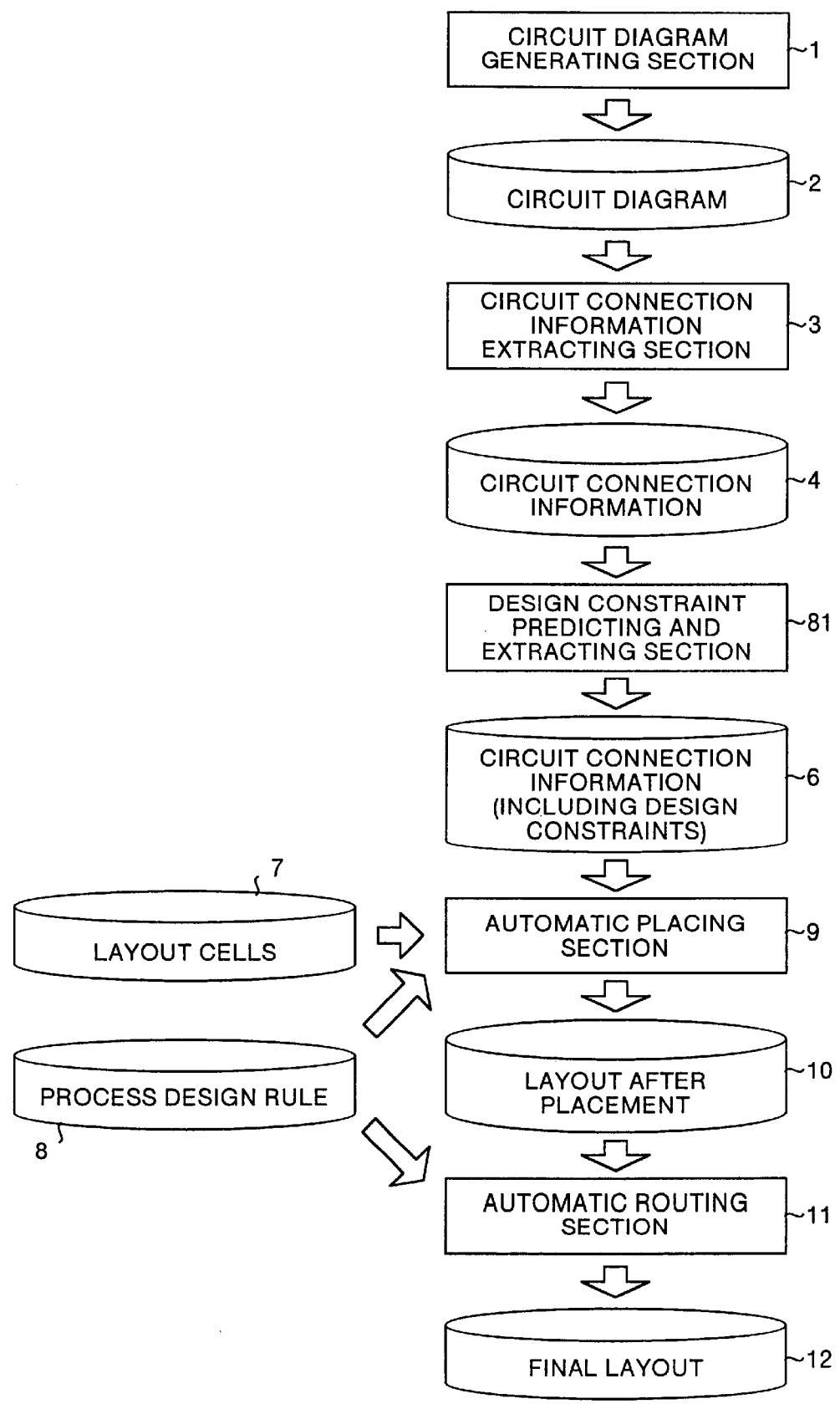

S : STANDARD EMITTER AREA SIZE

EVERY TRANSISTOR HAS 1xS SIZE

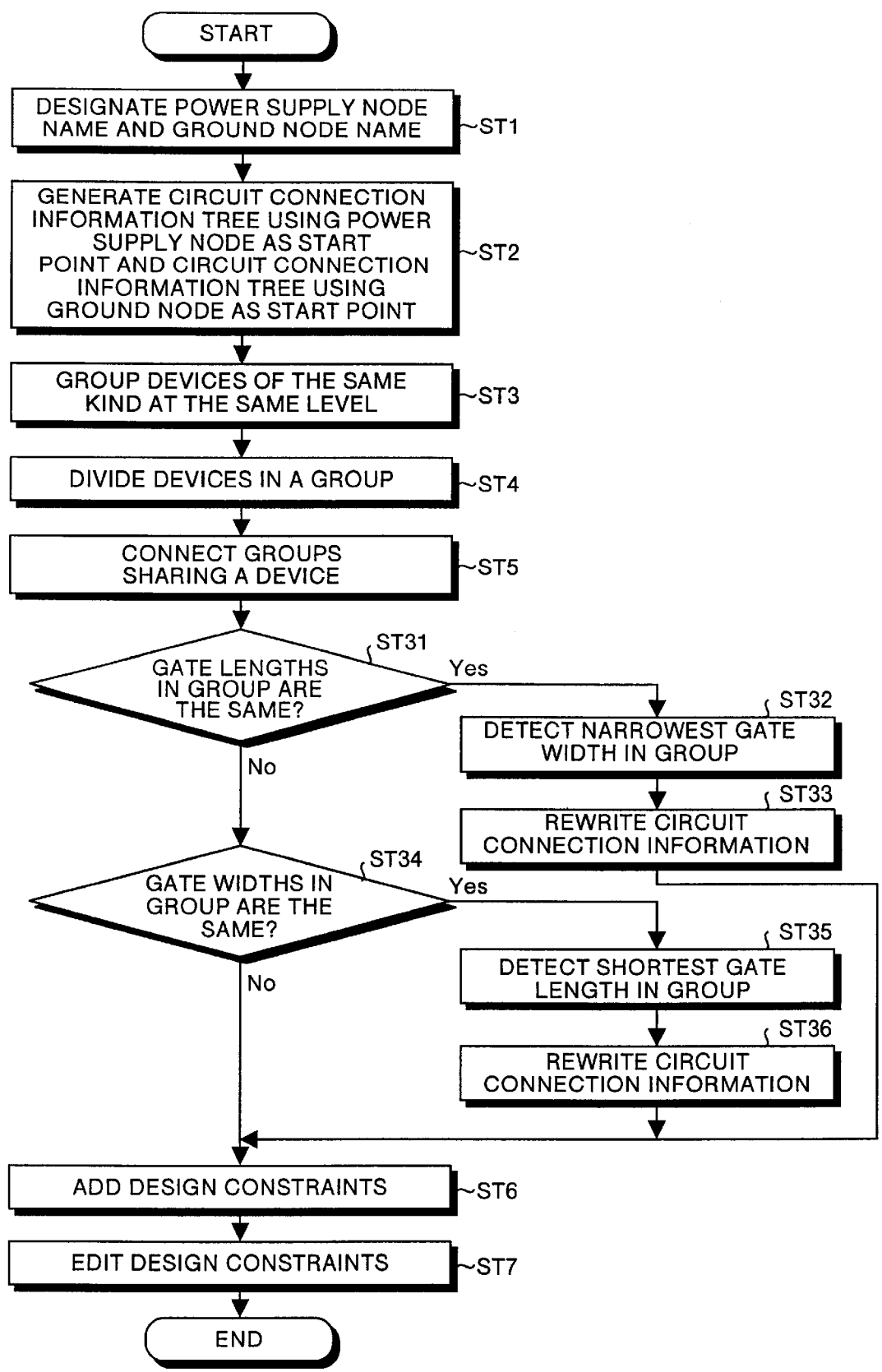

METHOD OF AND APPARATUS FOR DESIGNING LAYOUT OF ANALOG CELLS, AND COMPUTER PRODUCT

FIELD OF THE INVENTION

The present invention relates to a technology for designing layout of analog cells.

BACKGROUND OF THE INVENTION

In a semiconductor integrated circuit (IC), in recent years, the scale is becoming larger, the precision is becoming higher, and automation of layout designing is being advanced. Particularly, automation of layout designing of a logic circuit using a CMOS process is being advanced by employing a cell-based designing method or an ECA designing method. On the other hand, since an analog circuit needs high-precision DC characteristics, even when automatic placement and routing is conducted so as to simply satisfy the design rule of a wafer process, in most cases, desired electric characteristics cannot be obtained. In order to automate the layout designing of an analog circuit, the designer has to set all of layout design constraints as information. Most of the design constraints to be set relate to pairing of devices and placement of the paired devices on target positions in a layout. Consequently, conventional layout designing of an analog circuit employs a method of setting various design constraints such as designation of pairing of devices by the designer before layout designing. The outline will be described hereinbelow.

FIG. 30 is a block diagram showing the configuration of a conventional analog cell layout designing apparatus. As shown in FIG. 30, the analog cell layout designing apparatus has a circuit diagram generating section 101, a circuit diagram storing section 102, a design constraint input section 103, a design constraint data storing section 104, a circuit connection information extracting section 105, a circuit connection information storing section 106, a layout cell storing section 107, a process design rule storing section 108, an automatic placing section 109, a section 110 for storing layout after placement, an automatic routing section 111, and a final layout storing section 112.

When the designer draws an analog circuit by the circuit diagram generating section 101, circuit diagram data corresponding to the analog circuit diagram generated is written into the circuit diagram storing section 102. When the designer sets design constraints by the design constraint input section 103, the set design constraint data is written into the design constraint data storing section 104.

In the circuit connection information extracting section 105, circuit connection information is extracted from the analog circuit diagram data stored in the circuit diagram storing section 102 in consideration of the design constraint data stored in the design constraint data storing section 104, and the extracted circuit connection information including the design constraints is written into the circuit connection information storing section 106.

In the automatic placing section 109, on the basis of the circuit connection information including the design constraints stored in the circuit connection information storing section 106, applicable layout cells are read from layout cells stored in the layout cell storing section 107 and placed in accordance with a process design rule stored in the process design rule storing section 108. After completion of the placement, the placed layout cells are written in the section 110 for storing the layout after placement.

In the automatic routing section 111, routing of the layout cells stored in the section 110 for storing layout after placement is conducted according to the process design rule stored in the process design rule storing section 108, and a result of the execution is written into the final layout storing section 112.

The above-described analog cell layout designing method is realized by an automatic layout tool for analog cells, which is commercially available at present. As an idea of automating designing of layout of analog cells (blocks) from an analog circuit, a method of adding the layout design constraints to connection information of a circuit diagram, outputting the resultant, inputting the resultant to an automatic placing section, and reflecting the resultant in a layout is known. For example, Japanese Patent Application Laid-Open (JP-A) No. 7-73217 (device automatic placement apparatus) discloses a technique of separately providing a memory in which a pairing rule is stored and adding the design constraints read from the memory to connection information extracted from the circuit diagram.

The design constraints set in the design constraint input section 103 by the designer are, for example, settings (1) to (3) as described hereinbelow.

(1) To obtain an accurate voltage value and an accurate current value, for example, a setting of dividing a voltage as a reference (source voltage) by a plurality of resistive elements, each having an accurate zero-power resistance ratio, is made. For example, JP-A No. 5-129519 discloses a method of placing resistors so as to be symmetrical with respect to a line and so as to be perpendicular to a line of stress by a molding resin in order to obtain an accurate zero-power resistance ratio in layout design of resistors.

(2) In a current mirror circuit as shown in FIG. 31A, in order to obtain an accurate current ratio, a setting of constructing the current mirror circuit by a plurality of transistor devices having an accurate transistor size (area) ratio is made.

(3) Further, in designing the layout of a current mirror circuit as shown in FIG. 31A, a setting operation is performed as follows.

First, as shown in FIG. 31A, the designer draws up a list of the necessary number of devices from a circuit diagram. FIG. 31A shows three bipolar transistor devices of the same type. One of them is diode-connected. Each of the other two transistors has a normal transistor configuration. As shown in FIG. 31B, the designer considers the configuration of a current mirror circuit including the three bipolar transistor cells. FIG. 31B shows the current mirror circuit in which bipolar transistors B and C whose collectors are connected to each other are connected in parallel to a diode-connected bipolar transistor device A. The bases and emitters of the transistor devices are commonly connected to each other. Subsequently, as shown in FIG. 31C, the designer makes a setting placing the diode-connected bipolar transistor device A on a center line 120 and placing the bipolar transistor devices B and C whose collectors are connected to each other symmetrically on the right and left sides of the bipolar transistor device A.

However, the design constraints as described above are required irrespective of the circuit scale. Even in the case of a small-scaled analog circuit, the number of design constraints to be set is very large. Therefore, for the designer, much effort to make a setting for a memory or a circuit diagram is required. In many cases, considerable skill is required.

As a result, conventionally, automation of the layout designing of an analog circuit is delayed. Even designing analog cells in an actual IC occupies 60 to 70% of the turnaround time in designing a whole layout.

It is prime task to realize automatic setting of design constraints. For this purpose, at a stage before circuit connection information is input to the automatic placing section, a pre-process for adding information regarding dividing devices or the like to the circuit connection information is necessary. The question is how to realize it.

SUMMARY OF THE INVENTION

It is an object of the invention is to obtain a method of and an apparatus for designing layout of analog cells, capable of increasing layout designing precision and reducing a work of setting design constraints of the designer by automatically predicting design constraints of analog cell layout from circuit diagram data irrespective of the skill of the designer. It is another object of this invention to provide a computer readable recording medium that stores a computer program which when executed on a computer easily realizes the method according to the present invention on the computer.

The analog cell layout designing apparatus according to one aspect of this invention comprises a circuit diagram generating unit which generates an analog circuit diagram, circuit diagram storing unit to which circuit diagram data corresponding to the analog circuit diagram generated by the circuit diagram generating unit is written, a circuit connection information extracting unit which extracts circuit connection information from the analog circuit diagram data stored in the circuit diagram storing unit, a first circuit connection information storing unit which stores circuit connection information extracted by the circuit connection information extracting unit, a design constraint predicting and extracting unit which predicts and extracts devices to be paired from the circuit connection information stored in the first circuit connection information storing unit and adding the extracted devices as design constraints to the circuit connection information, a second circuit connection information storing unit which stores the circuit connection information to which the design constraints are added by the design constraint predicting and extracting unit, an automatic placing unit which places layout cells selected on the basis of the circuit connection information including the design constraints, stored in the second circuit connection information storing unit in accordance with a process design rule, and an automatic routing unit which conducts routing of the layout cells placed by the automatic placing unit in accordance with the process design rule.

According to the above-mentioned aspect of this invention, circuit diagram data of an analog circuit diagram is generated by the circuit diagram generating unit and is written and stored into the circuit diagram storing unit. When circuit connection information is extracted by the circuit connection information extracting unit from the analog circuit diagram data stored in the circuit diagram storing unit, it is written and stored in the first circuit connection information storing unit. When devices to be paired are predicted and extracted from the circuit connection information stored in the first circuit connection information storing unit and added as design constraints to the circuit connection information, the resultant is written and stored in the second circuit connection information storing unit. As a result, in the automatic placing unit, layout cells are selected on the basis of the circuit connection information including the design constraints, stored in the second circuit connection information storing unit and placed in accordance with a process design rule. The layout cells placed by the automatic placing unit are routed in accordance with the process design rule by the automatic routing unit.

The analog cell layout designing method according to another aspect of this invention comprises a circuit diagram generating step of generating an analog circuit diagram, a circuit diagram data storing step of storing circuit diagram data corresponding to the analog circuit diagram generated in the circuit diagram generating step, a circuit connection information extracting step of extracting circuit connection information from the stored analog circuit diagram data, a first circuit connection information storing step of storing the circuit connection information extracted in the circuit connection information extracting step, a design constraint predicting and extracting step of predicting and extracting devices to be paired from the stored circuit connection information and adding the extracted devices as design constraints to the circuit connection information, a second circuit connection information storing step of storing the circuit connection information to which the design constraints are added in the design constraint predicting and extracting step, an automatic placing step of placing layout cells selected on the basis of the stored circuit connection information including the design constraints in accordance with a process design rule, and an automatic routing step of conducting routing of the layout cells placed in the automatic placing step in accordance with the process design rule.

According to the above-mentioned aspect of this invention, when circuit diagram data corresponding to the analog circuit diagram is generated in the circuit diagram generating step, it is written and stored into the circuit diagram storing unit. In the circuit connection information extracting step, circuit connection information is extracted from the analog circuit diagram data stored in the circuit diagram storing unit and is written and stored into the first circuit connection information storing unit. In the design constraint predicting and extracting step, devices to be paired are predicted and extracted from the circuit connection information stored in the first circuit connection information storing unit and the extracted devices to be paired are added as design constraints to the circuit connection information. The resultant is written and stored into the second circuit connection information storing unit. In the automatic placing step, layout cells are selected on the basis of the circuit connection information including the design constraints stored in the second circuit connection information storing unit and placed in accordance with a process design rule. In the automatic routing step, the layout cells placed in the automatic placing step are routed in accordance with the process design rule.

The computer readable recording medium according to still another aspect of this invention stores a computer program which when executed on a computer easily realizes the method according to the present invention on the computer.

Other objects and features of this invention will become apparent from the following description with reference to the accompanying drawings.

BRIEF DESCRIPTION OF THE DRAWINGS

FIG. 19 is a block diagram showing the configuration of an analog cell layout designing apparatus according to a fifth embodiment of this invention.

FIG. 23 is a flowchart for explaining the operation of a design constraint predicting and extracting section illustrated in FIG. 22.

DETAILED DESCRIPTIONS

Embodiments of a method of and an apparatus for designing layout of analog cells according to the invention will be described in detail hereinbelow with reference to the attached drawings.

Figure 1:
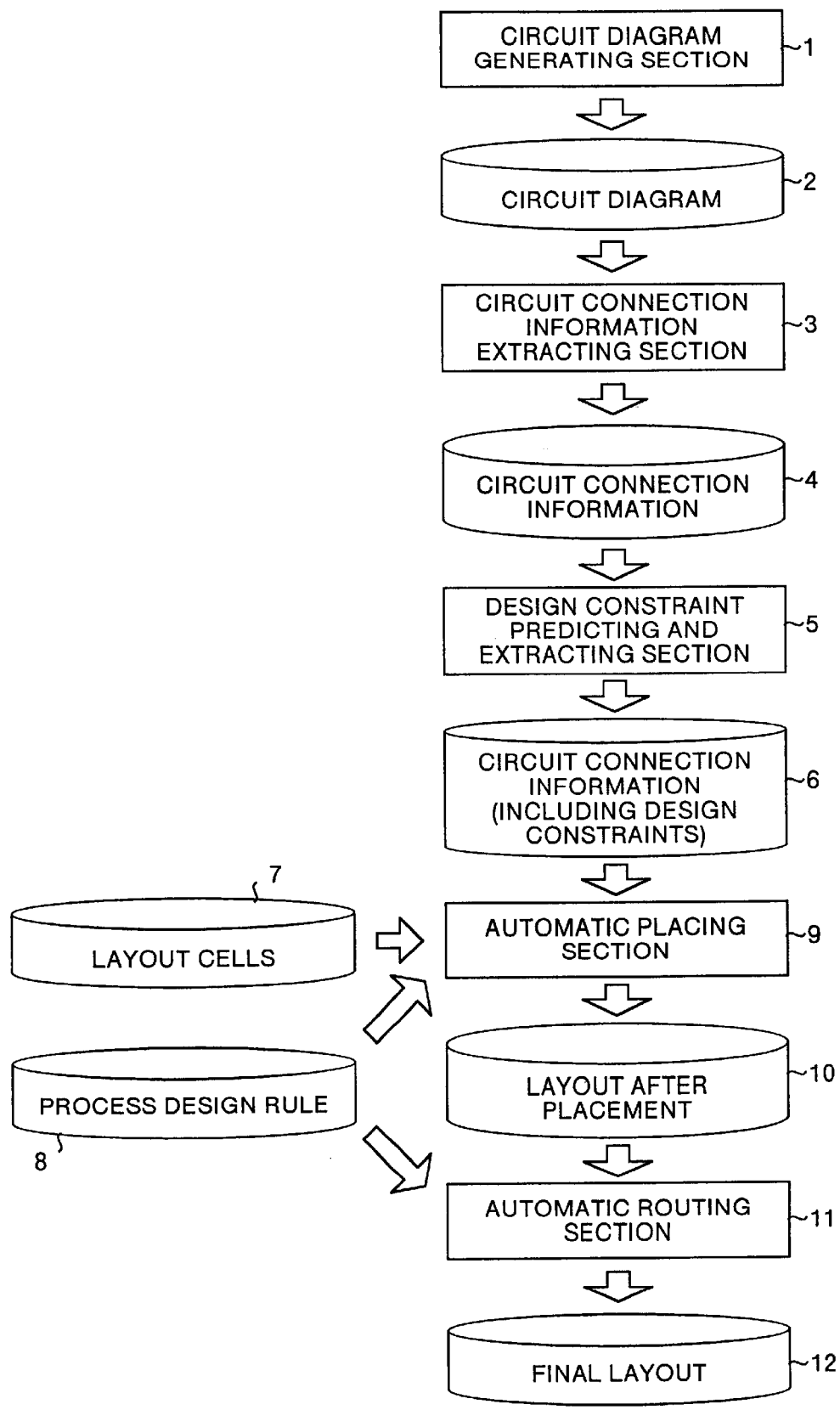
FIG. 1 is a block diagram showing the configuration of an analog cell layout designing apparatus according to a first embodiment of this invention.

FIG. 1 is a block diagram showing the configuration of an analog cell layout designing apparatus according to a first embodiment of this invention. As shown in FIG. 1, the analog cell layout designing apparatus has a circuit diagram generating section 1, a circuit diagram storing section 2, a circuit connection information extracting section 3, a circuit connection information storing section 4, a design constraint predicting and extracting section 5, a circuit connection information storing section 6, a layout cell storing section 7, a process design rule storing section 8, an automatic placing section 9, a section 10 for storing layout after placement, an automatic routing section 11, and a final layout storing section 12.

Figure 30:
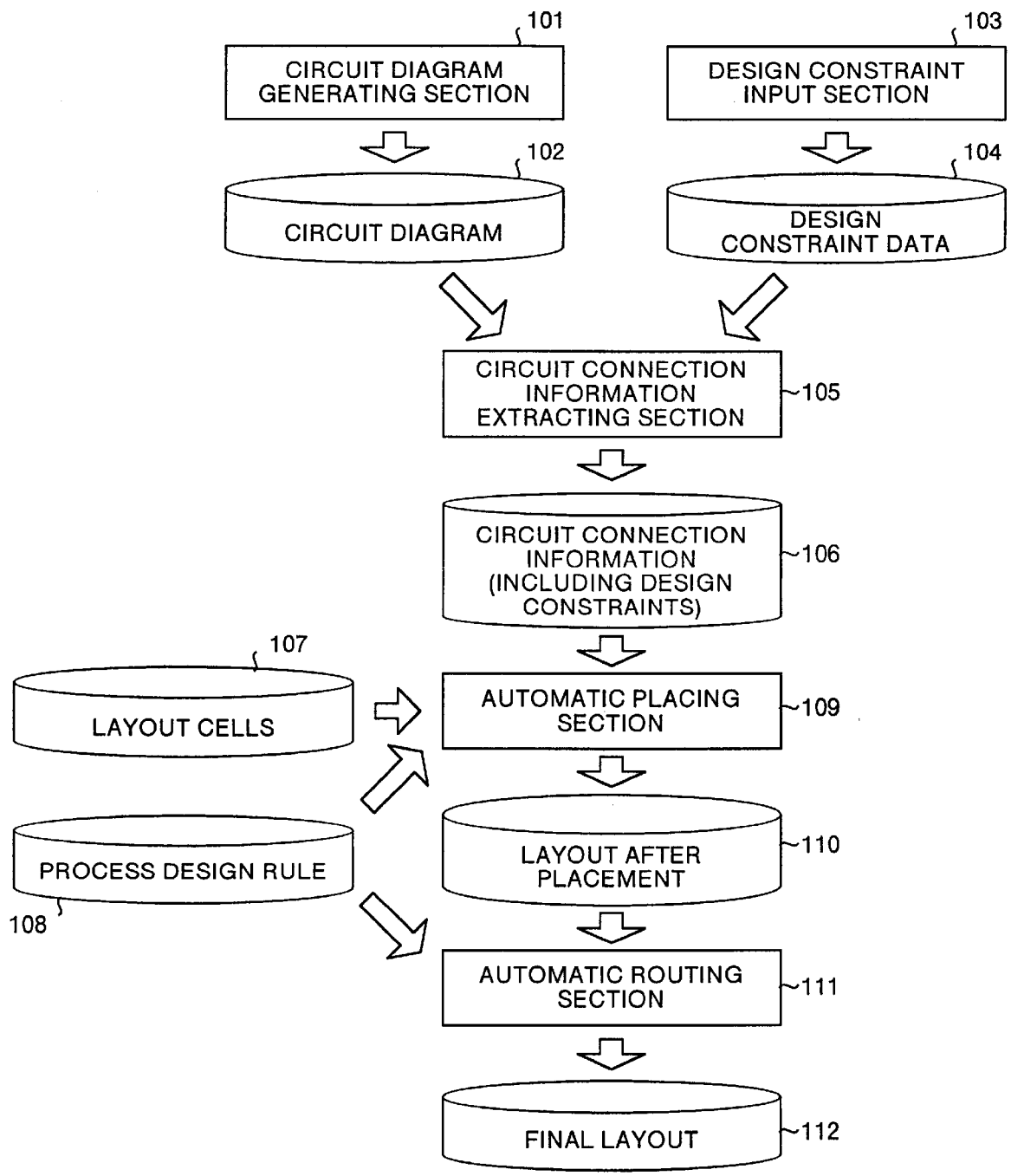
FIG. 30 is a block diagram showing an example of the configuration of a conventional analog cell layout designing apparatus.
Figure 31A:
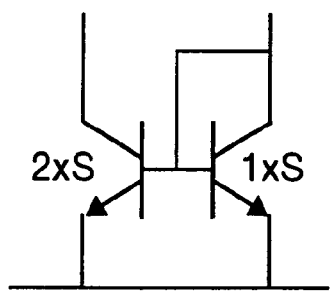
FIGS. 31A to 31C are diagrams showing an example of the layout of a current mirror circuit.
Figure 31B:
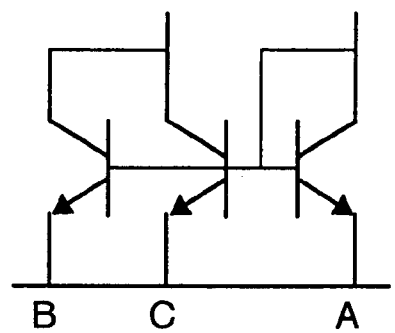
Figure 31C:
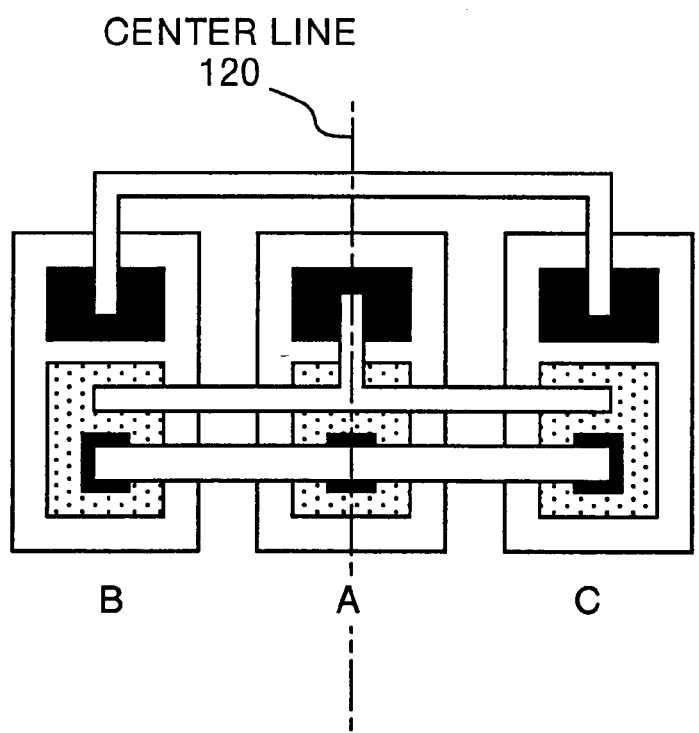

The analog cell layout designing apparatus has the configuration, as obvious by comparison with the conventional technique (see FIG. 30), obtained by omitting the design constraint input section 103 and the design constraint data storing section 104 in FIG. 30 and providing the design constraint predicting and extracting section 5 and the circuit connection information storing section 6 between the circuit connection information storing section 106 and the automatic routing section 109 as shown in FIG. 1.

First, the operation of the whole will be described. When the designer draws an analog circuit by the circuit diagram generating section 1, circuit diagram data corresponding to the analog circuit diagram generated is written into the circuit diagram storing section 2. In the circuit connection information extracting section 3, circuit connection information is extracted from the analog circuit diagram data stored in the circuit diagram storing section 2, and the extracted circuit connection information is written into the circuit connection information storing section 4.

In the design constraint predicting and extracting section 5, from the circuit connection information stored in the circuit connection information storing section 4, devices to be paired are predicted and extracted by a procedure shown in FIG. 2 which will be described here in later, the predicted and extracted devices are added as design constraints to the circuit connection information, and the resultant is written in the circuit connection information storing section 6.

In the automatic placing section 9, on the basis of the circuit connection information including the design constraints stored in the circuit connection information storing section 6, applicable layout cells are read from layout cells stored in the layout cell storing section 7 and placed in accordance with a process design rule stored in the process design rule storing section 8. After completion of the placement, the placed layout cells are written in the section 10 for storing the layout after placement.

In the automatic routing section 11, routing of the layout cells stored in the section 110 for storing layout after placement is conducted according to the process design rule stored in the process design rule storing section 8, and the execution result is written in the final layout storing section 12.

As described above, in the analog cell layout designing apparatus, the designer does not preliminarily set and input the design constraints but, at the stage before the circuit connection information is input to the automatic placing section 9, the design constraints predicting and extracting section 5 automatically predicts devices which have to be paired on the basis of the circuit connection information and can add the predicted devices as design constraints to the circuit connection information.

Figure 2:
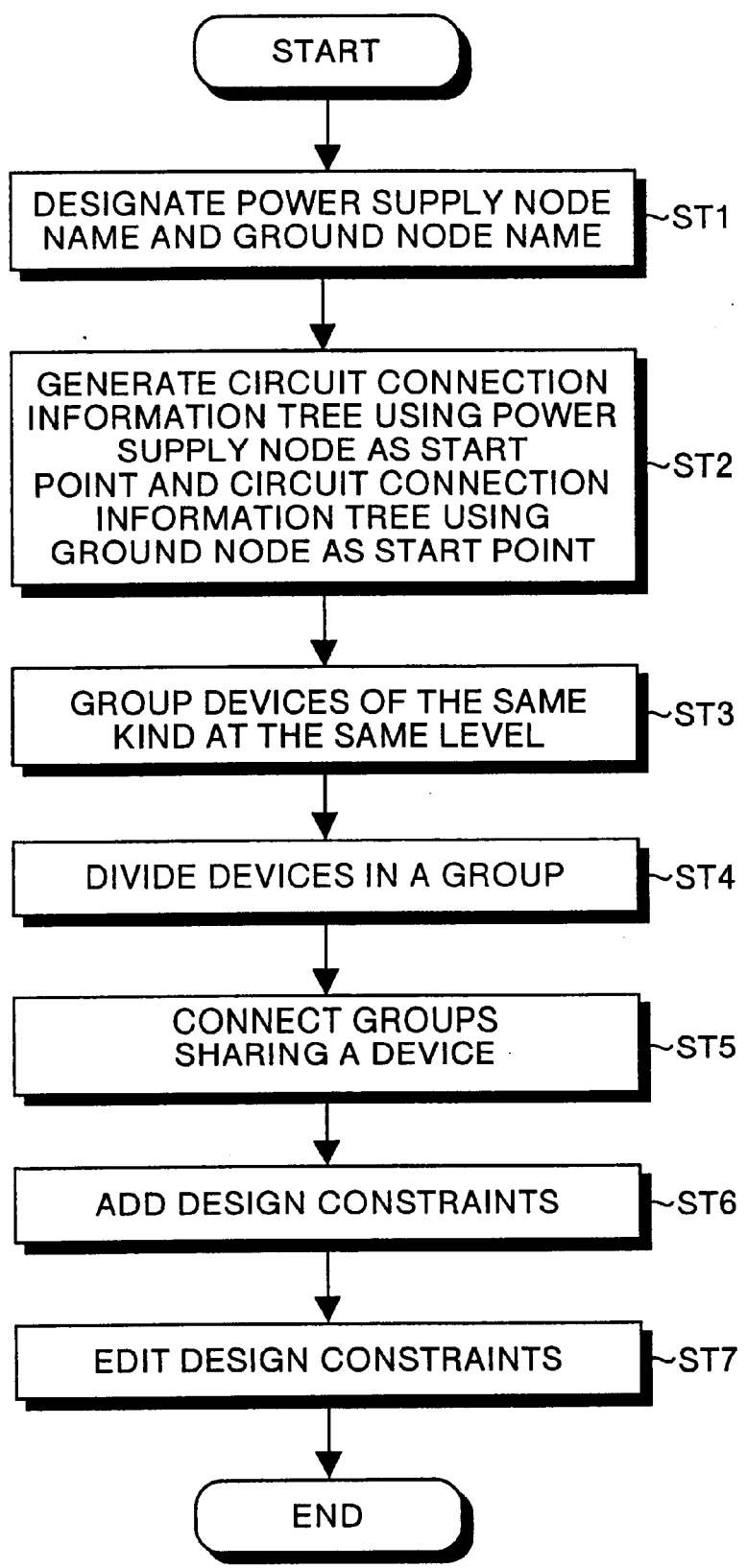
FIG. 2 is a flowchart for explaining the operation of a design constraint predicting and extracting section illustrated in FIG. 1.
Figure 3:
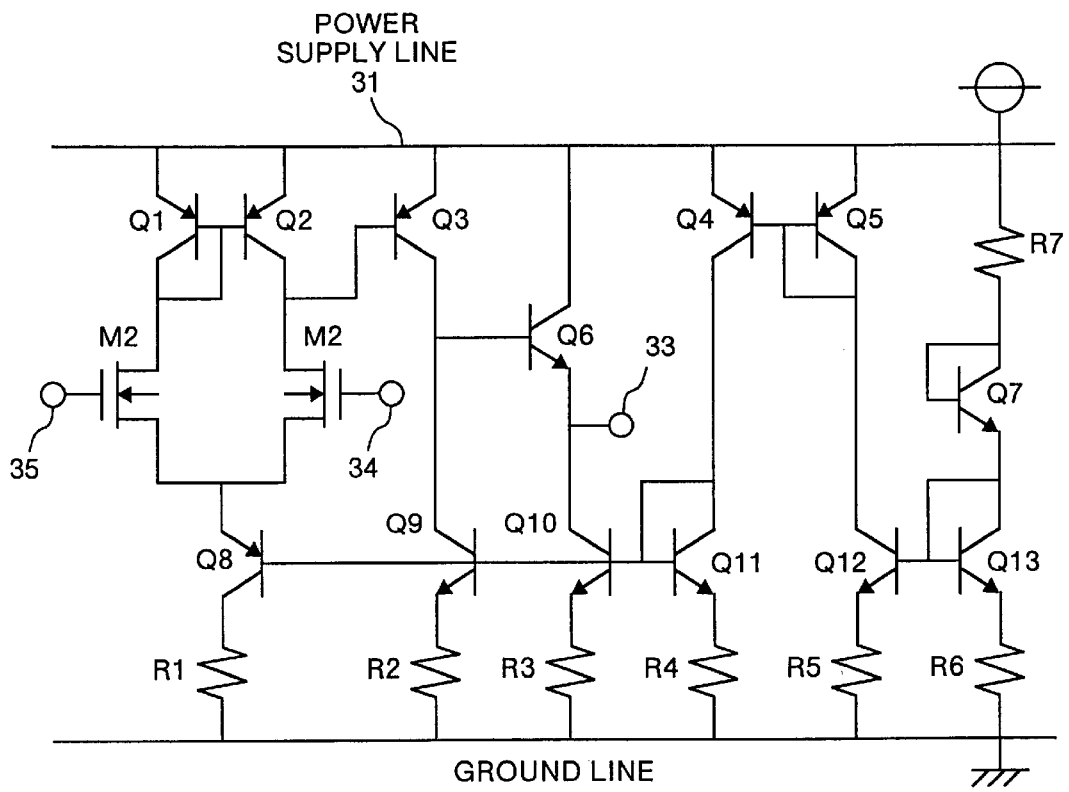
FIG. 3 is a diagram showing an example of analog circuit diagram data stored in the circuit diagram storing section illustrated in FIG. 1.
Figure 4:
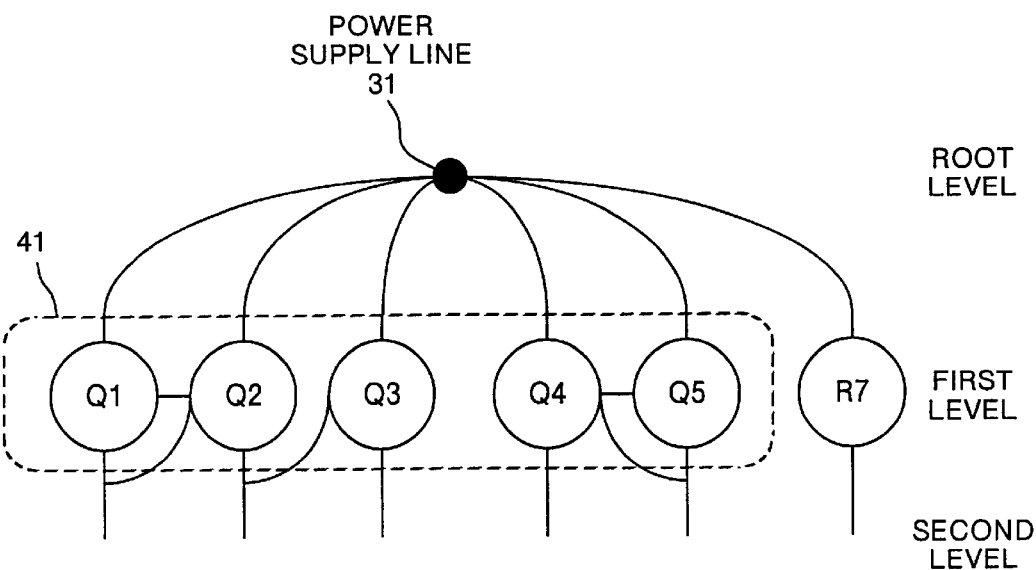
FIG. 4 is a diagram showing a circuit connection information tree extracted by using a power supply line as a start point from the analog circuit diagram data illustrated in FIG. 3 and a state in which devices of the same kind at the same level are grouped.
Figure 5:
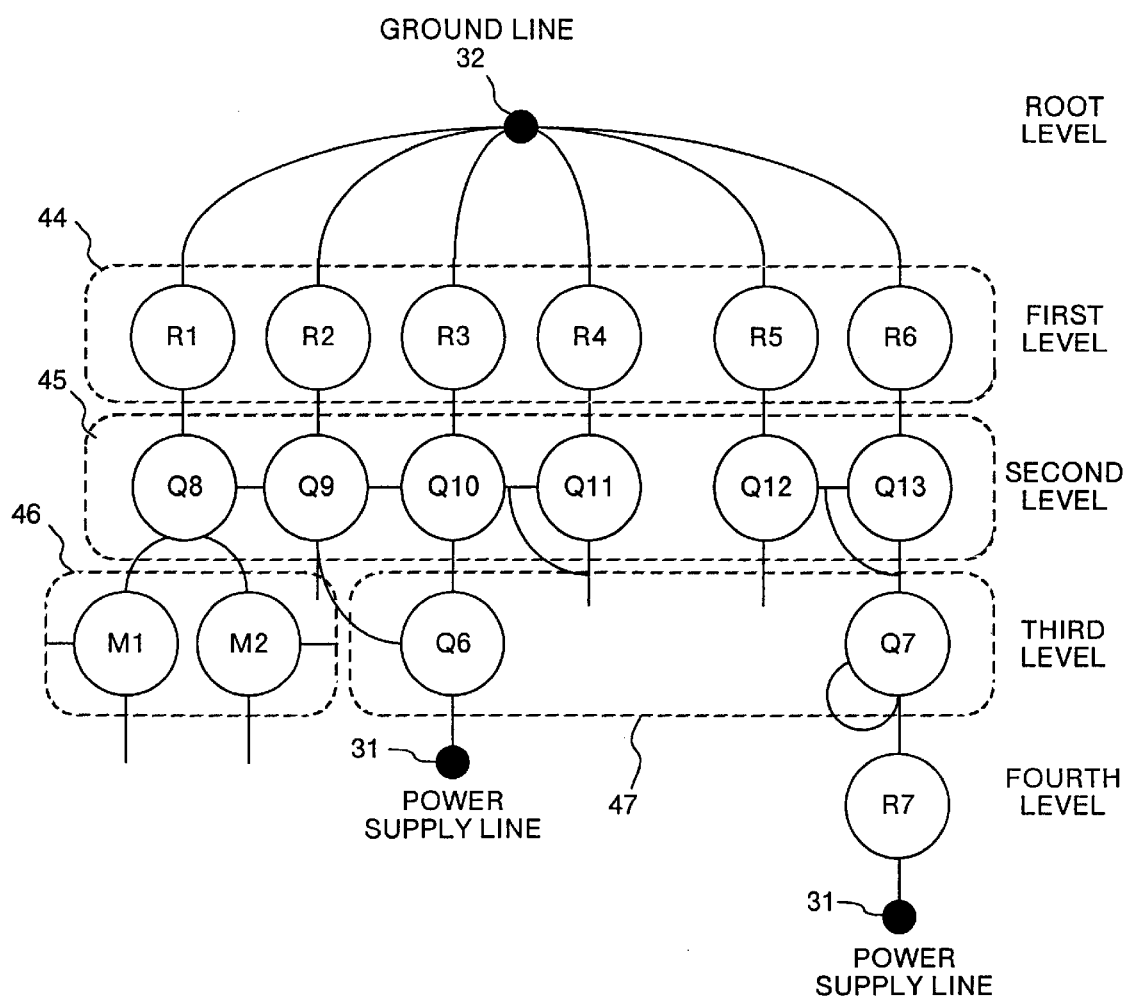
FIG. 5 is a diagram showing a circuit connection information tree extracted by using a ground line as a start point from the analog circuit diagram data illustrated in FIG. 3 and a state in which devices of the same kind at the same level are grouped.
Figure 6:
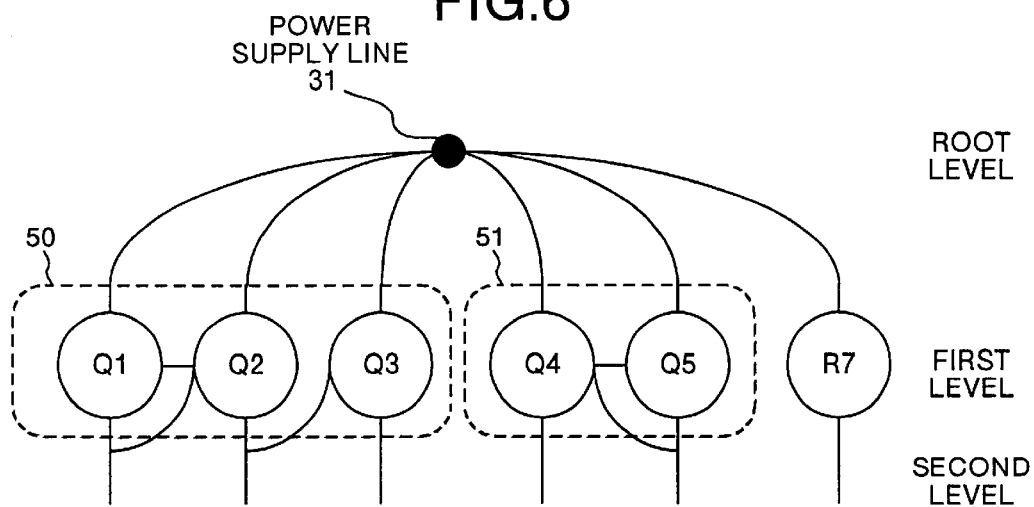
FIG. 6 is a diagram showing a state in which devices connected to the same line other than the power supply line are further grouped in the grouped devices shown in FIG. 4.
Figure 7:
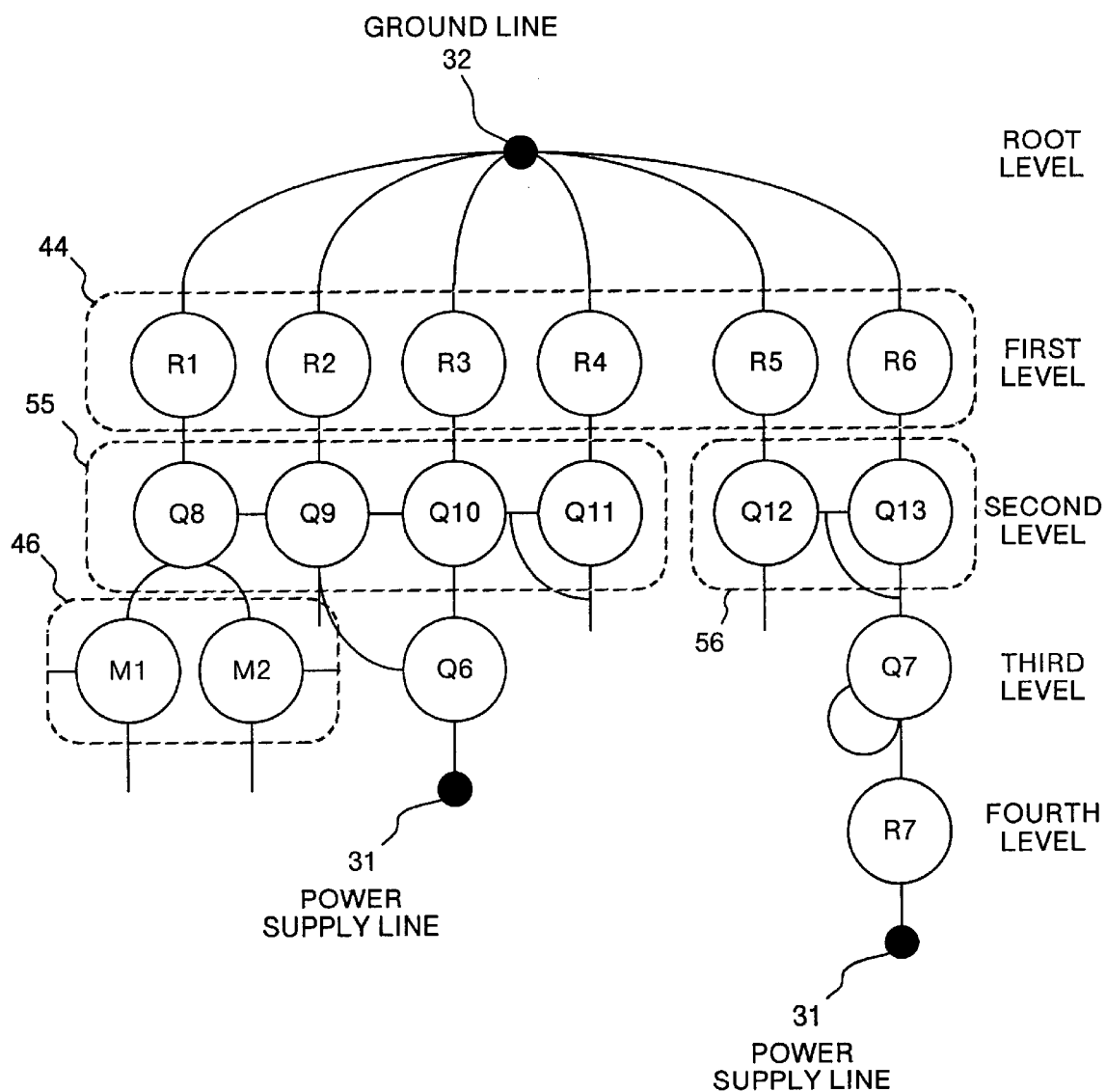
FIG. 7 is a diagram showing a state in which devices connected to the same line other than the ground line are further grouped in the grouped devices shown in FIG. 5.
Figure 8:
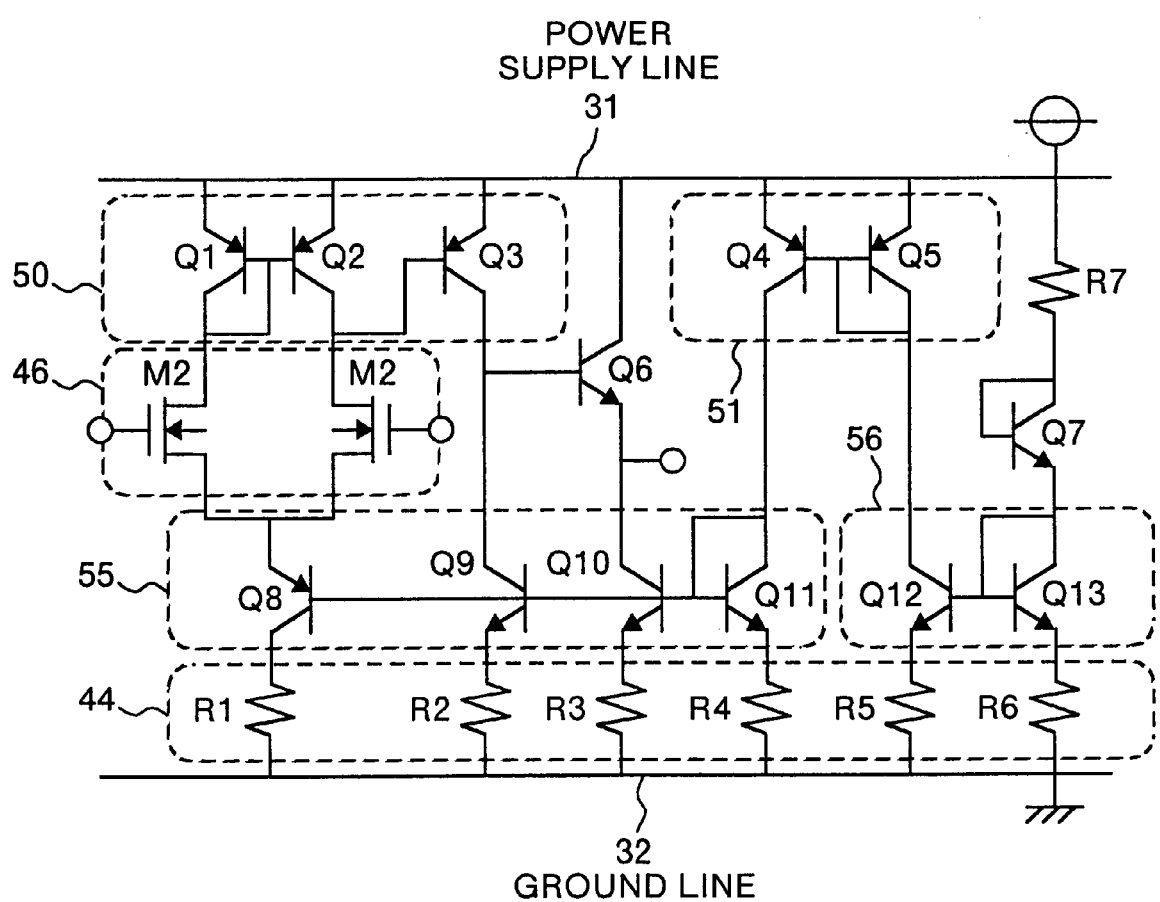
FIG. 8 is a diagram showing a result of connecting the sub groups illustrated in FIGS. 6 and 7 and adding circuit connection information.

Referring to FIGS. 1 to 8, the operations in the design constraint predicting and extracting section 5 will be concretely described. FIG. 2 is a flowchart for explaining the operation of the design constraint predicting and extracting section shown in FIG. 1. FIG. 3 is a diagram showing an example of analog circuit diagram data stored in the circuit diagram storing section illustrated in FIG. 1. FIG. 4 is a diagram showing a circuit connection information tree extracted from the analog circuit diagram data illustrated in FIG. 3 by using a power supply line as a start point and a state where devices of the same kind at the same level are grouped. FIG. 5 is a diagram showing a circuit connection information tree extracted from the analog circuit diagram data illustrated in FIG. 3 by using a ground line as a start point and a state where devices of the same kind at the same level are grouped. FIG. 6 is a diagram showing a state in which devices connected to the same line other than the power supply lines in the grouped devices shown in FIG. 4 are further grouped. FIG. 7 is a diagram showing a state in which devices connected to the same line other than the ground lines in the grouped devices shown in FIG. 5 are further grouped. FIG. 8 is a diagram showing a result of connecting the subdivided areas illustrated in FIGS. 6 and 7 and circuit connection information is added.

In FIG. 1, in the circuit connection information storing section 4, for example, the circuit connection information extracted from the analog circuit diagram data shown in FIG. 3 is stored. In FIG. 3, to a power supply line 31, one end of a resistive element R7, emitters of PNP transistor devices Q5 and Q4 constructing a current mirror circuit, the collector of an NPN bipolar transistor Q6, the emitter of a PNP transistor device Q3, and emitters of PNP transistor devices Q2 and Q1 constructing a current mirror circuit are connected.

The other end of the resistive element R7 is connected to the collector of a diode-connected NPN transistor device Q7. The emitter of the NPN transistor device Q7 is connected to the collector of a diode-connected NPN transistor device Q13. The emitter of the NPN transistor device Q13 is connected to a ground line 32 via the resistive element R6. The collector of the diode-connected PNP transistor device Q5 is connected to the collector of an NPN transistor device Q12. The emitter of the NPN transistor device Q12 is connected to the ground line 32 via a resistive element R5. The NPN transistor devices Q12 and Q13 construct a current mirror circuit.

The collector of the PNP transistor device Q4 is connected to the collector of a diode-connected NPN transistor device Q11. The emitter of the NPN transistor device Q11 is connected to the ground line 32 via a resistive element R4. The collector of the NPN transistor device Q6 is connected to both an output terminal 33 and the collector of an NPN transistor device Q10. The emitter of the NPN transistor device Q10 is connected to the ground line 32 via a resistive element R3. The base of the NPN transistor device Q6 is connected to both the collector of the PNP transistor device Q3 and the collector of an NPN transistor device Q9. The emitter of the NPN transistor device Q9 is connected to the ground line 32 via a resistive element R2.

The base of the PNP transistor device Q3 is connected to both the collector of the PNP transistor device Q2 and the drain of a P-type MOS transistor device M2. The gate of the P-type MOS transistor device M2 is connected to an input terminal 34. The collector of the diode-connected PNP transistor device Q1 is connected to the drain of a P-type MOS transistor device M1. The gate of the P-type MOS transistor device M1 is connected to an input terminal 35. The P-type MOS transistor devices M1 and M2 construct a differential pair. The sources of the P-type MOS transistor devices M1 and M2 are connected to the collector of an NPN transistor device Q8. The emitter of the NPN transistor device Q8 is connected to the ground line 32 via a resistive element R1. The NPN transistor devices Q8 to Q11 construct a current mirror circuit.

In FIG. 2, in step ST1, the circuit connection information extracted from the analog circuit diagram data shown in FIG. 3 is read from the circuit connection information storing section 4, the name of a power supply node is given to the power supply line 31 and the name of a ground node is given to the ground line 32.

In step ST2, a circuit connection information tree using the designated nodes as starting points. Concretely, a circuit connection information tree indicative of the connection relation of the P-type (PNP and PMOS) transistor devices and the connection relation of the resistive elements to the power supply line 31 is generated. A circuit connection information tree indicative of the connection relation of N-type (NPN and NMOS) transistor devices and the connection relation of the resistive elements to the ground line 32 is generated. The circuit connection information tree is generated by developing all the transistor devices and the resistive elements into a hierarchy.

In step ST3, in the circuit connection information trees generated as described above, the devices of the same kind at the same level are grouped. For example, as shown in FIG. 4, the power supply line 31 is set as the root level and the first level, second level, . . . follow. As devices positioning at the first level, the PNP transistor devices Q1 to Q5 and the resistive element R7 are picked up and form the circuit connection information tree. A group 41 surrounded by a broken line includes the PNP transistor devices Q1 to Q5 as the devices of the same kind.

For example, as shown in FIG. 5, the ground line 32 is set as the root level, and the first level, second level, third level, fourth level, . . . are sequentially set. As devices positioning at the first level, the resistive elements R1 to R6 are picked up. As devices positioning at the second level, the NPN transistor devices Q8 to Q13 are picked up. As devices positioned at the third level, the P-type MOS transistor devices M1 and M2 and the NPN transistor devices Q6 and Q7 are picked up. At the fourth level, the resistive element R7 is picked up and connected to the power supply line 31.

In the circuit connection information tree, at the first level, a group 44 of the resistive elements R1 to R6 is formed. At the second level, a group 45 of the NPN transistor devices Q8 to Q13 is formed. At the third level, a group 46 of the P-type MOS transistors M1 and M2 and a group 47 of the NPN transistor devices Q6 and Q7 are formed.

In step ST4, each of the groups is further divided by selecting the devices connected to the same line other than the power supply line 31 and the devices connected to the same line other than the ground line 32 from the devices grouped as described above. For example, in the group 41 shown in FIG. 4, in the PNP transistor devices Q1 to Q3, the bases of the PNP transistor devices Q1 and Q2 are connected to each other, and the collector of the PNP transistor device Q2 and the base of the PNP transistor device Q3 are connected to each other. The bases of the PNP transistor devices Q4 and Q5 are connected to each other. Therefore, the group 41 shown in FIG. 4 is further divided into, as shown in FIG. 6, a group 50 of the PNP transistor devices Q1 to Q3 and a group 51 of the PNP transistor devices Q4 and Q5.

Similarly, the group 45 shown in FIG. 5 is further divided into, as shown in FIG. 7, a group 55 of the NPN transistor devices Q8 to Q11 and a group 56 of the NPN transistor devices Q12 and Q13. In the group 47 shown in FIG. 5, since there is no connection relation between the NPN transistor devices Q6 and Q7, the NPN transistor devices Q6 and Q7 are separated from each other as shown in FIG. 7.

In step ST5, the subdivided device groups sharing the devices are coupled. In step ST6, the subdivided device groups are added as device pairing constraints to the circuit connection information read from the circuit connection information storing section 4. FIG. 8 shows a result of connecting the device groups sharing the devices shown in FIGS. 6 and 7 to each other, and adding the groups to the circuit connection information.

In FIG. 8, the groups 50, 51, 46, 55, 56, and 44 can be predicted as the design constraints (devices to be paired) In step ST7, the design constraints are edited, and the circuit connection information to which the edited design constraints are added is written in the circuit connection information storing section 6.

As described above, according to the first embodiment, at a stage before the circuit connection information is supplied to the automatic placing section 9, devices to be paired are predicted and extracted from the circuit connection information and added as design constraints to the circuit connection information supplied to the automatic placing section 9. Therefore, the uniform design constraints which do not depend on the skill of the designer can be added and the precision of layout designing can be consequently increased.

Since the designer does not have to set all the design constraints, the trouble of setting the design constraints of the designer can be reduced, and the layout designing can be facilitated.

Figure 9:
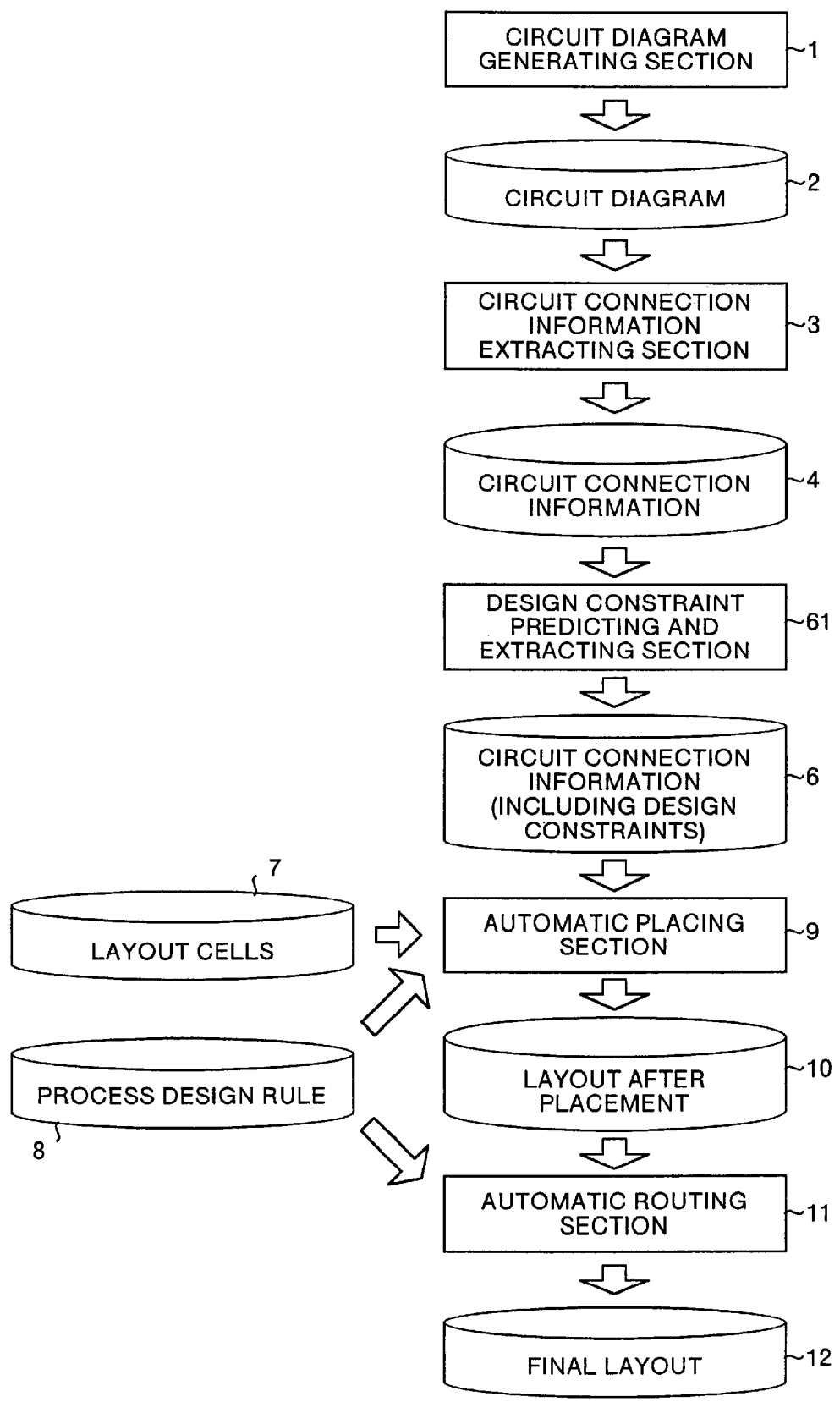
FIG. 9 is a block diagram showing the configuration of an analog cell layout designing apparatus according to a second embodiment of this invention.

FIG. 9 is a block diagram showing the configuration of an analog cell layout designing apparatus according to a second embodiment of this invention. In FIG. 9, the same or corresponding components as those shown in FIG. 1 are designated by the same reference numerals. The portion related to the second embodiment will be mainly described here.

As shown in FIG. 9, in the second embodiment, in place of the design constraint predicting and extracting section 5 shown in FIG. 5, a design constraint predicting and extracting section 61 is provided. The design constraint predicting and extracting section 61 performs, in addition to the operations of the design constraint predicting and extracting section 5, the following operations. When the circuit connection information trees generated in the first embodiment have a branch extending from the power supply line to the ground line and a branch extending from the ground line to the power supply line, all the devices of the same kind existing in each of the branches are grouped, the branch device group and the group obtained by connecting the subdivided groups in the first embodiment which share a device are connected to each other, the subdivided group and the branch device group are added as device paring constraints to the circuit connection information.

Figure 10:
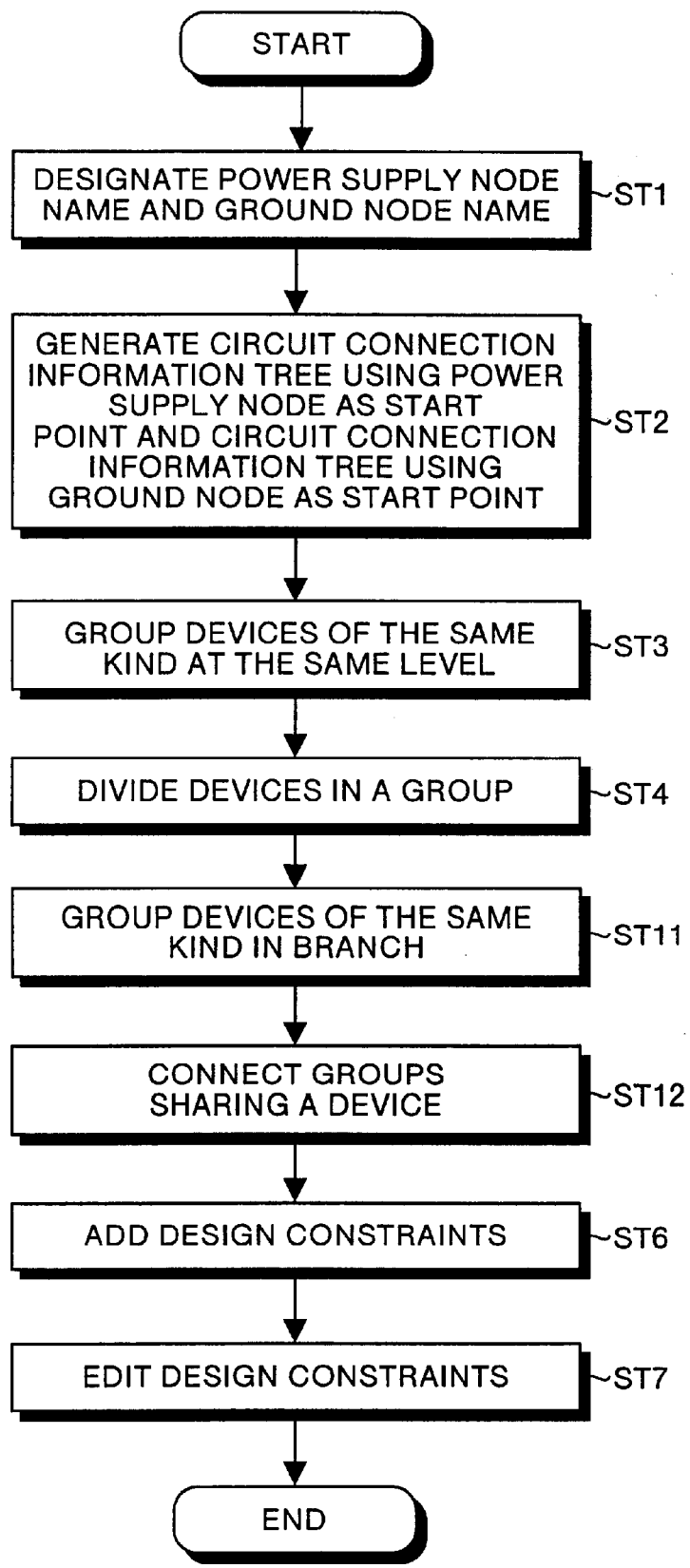
FIG. 10 is a flowchart for explaining the operation of the design constraint predicting and extracting section shown in FIG. 9.
Figure 11:
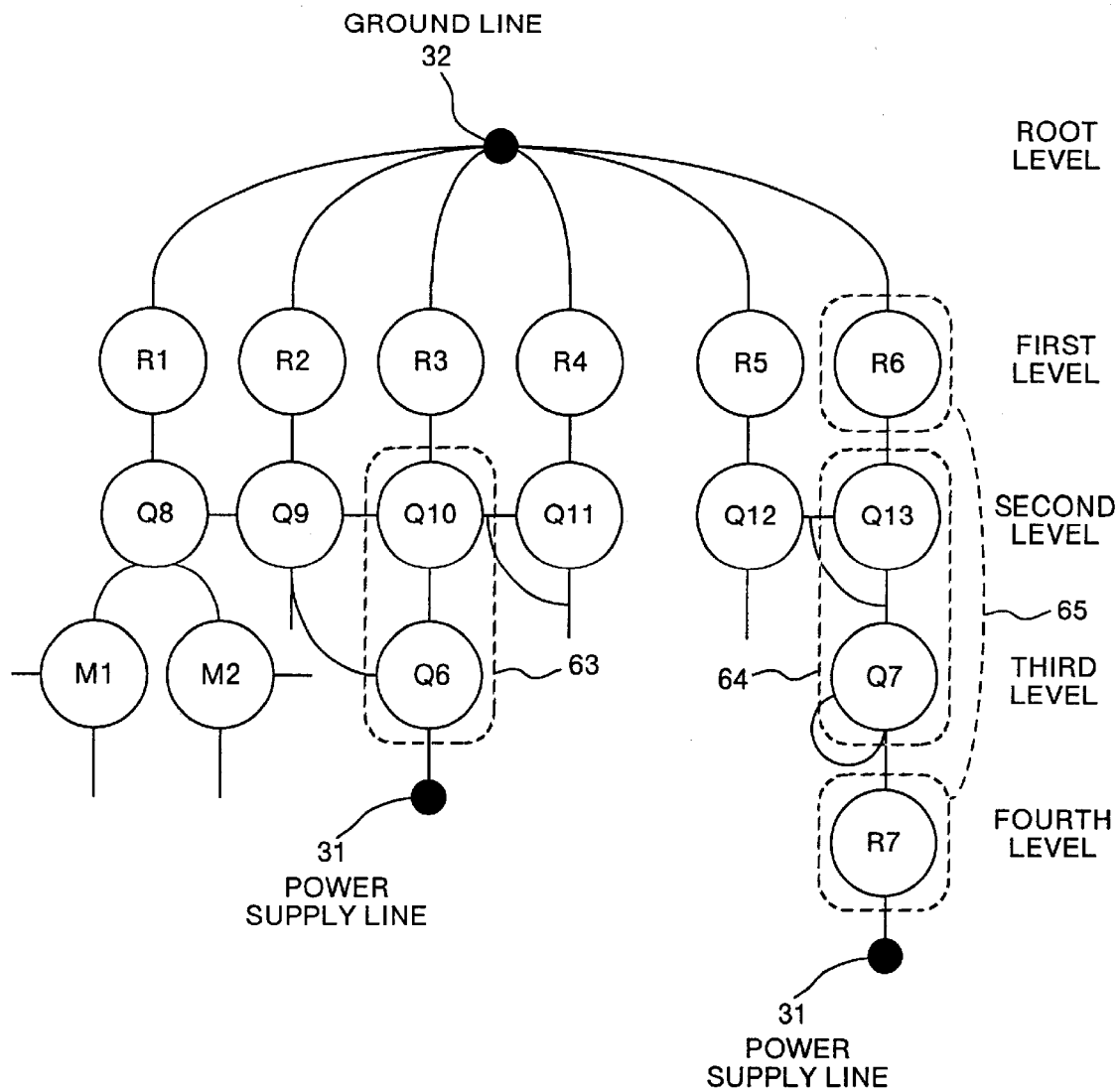
FIG. 11 is a diagram showing a state where devices of the same kind existing in a branch extending from the ground line to the power supply line in the circuit connection information tree illustrated in FIG. 7 are grouped.
Figure 12:
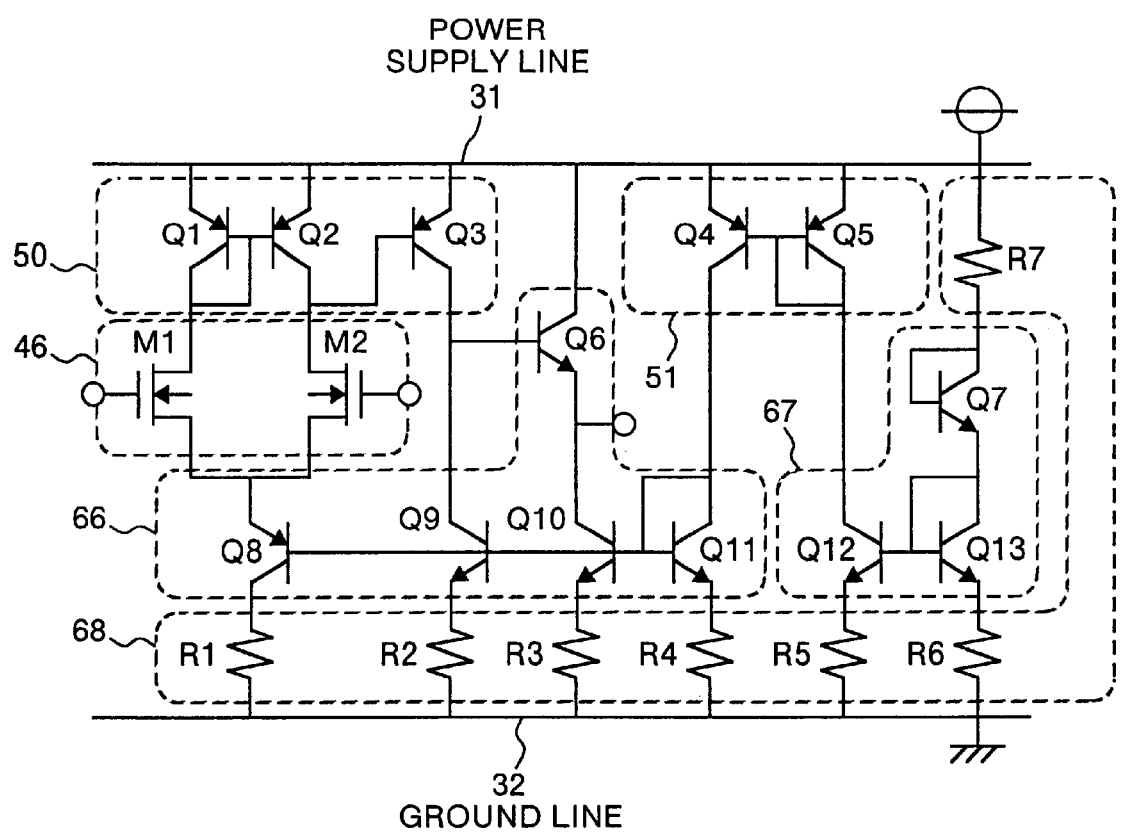
FIG. 12 is a diagram showing a result of connecting the sub groups illustrated in FIGS. 6 and 7 and the grouped devices of the same kind in a branch in each of the circuit connection information trees illustrated in FIGS. 6 and 7.

Referring to FIGS. 9 to 12, the operation in the design constraint predicting and extracting section 61 will be concretely described. FIG. 10 is a flow chart for explaining the operation of the design constraint predicting and extracting section 61 shown in FIG. 9. FIG. 11 is a diagram showing a state where devices of the same kind existing in the branch extending from the ground line 32 to the power supply line 31 are grouped in the circuit connection information tree illustrated in FIG. 7. FIG. 12 is a diagram showing a result of connecting the subdivided groups illustrated in FIGS. 6 and 7 and the group of devices of the same kind in the branch in the circuit connection information trees illustrated in FIGS. 6 and 7 and adding the circuit connection information.

In FIG. 10, the same processes as those shown in FIG. 2 are designated by the same reference numerals. The portion related to the second embodiment will be mainly described here. In FIG. 10, in step ST11, in each of the two kinds of circuit connection information trees generated in step ST2, devices of the same kind in a branch are detected and grouped. Specifically, in the circuit connection information tree shown in FIG. 6, a branch extending from the power supply line 31 to the ground line 32 is detected and all the devices of the same kind existing in the branch are grouped. In the circuit connection information tree shown in FIG. 7, a branch extending from the ground line 32 to the power supply line 31 is detected and all the devices of the same kind existing in the branch are grouped. In FIG. 11, a group 63 of the NPN transistor devices Q10 and Q6, a group 64 of the NPN transistor devices Q13 and Q7, and a group 65 of the resistive elements R6 and R7 are shown.

In step ST12, in the subdivided groups formed in step ST4 and the groups formed in step ST11, groups sharing a device are coupled. In step ST6, the subdivided groups formed in step ST4 and the groups formed in step ST11 are added as device paring constraints to the circuit connection information read from the circuit connection information storing section 4. FIG. 12 shows the result of coupling the groups sharing a device among the groups shown in FIGS. 6, 7, and 11 and adding the groups to the circuit connection information.

FIGS. 8 and 12 will be compared with each other. In FIG. 12, a branch device (PNP transistor device Q6) is added to the group 55 shown in FIG. 8, thereby forming a group 66. A branch device (PNP transistor device Q7) is added to the group 56 shown in FIG. 8, thereby forming a group 67. A branch device (resistive element R7) is added to the group 44 shown in FIG. 8, thereby forming a group 68.

As described above, according to the second embodiment, the groups of devices in the branches extending between the power supply line and the ground line can be also considered as objects, so that the larger number of design constraints as compared with the first embodiment can be predicted.

Figure 13:
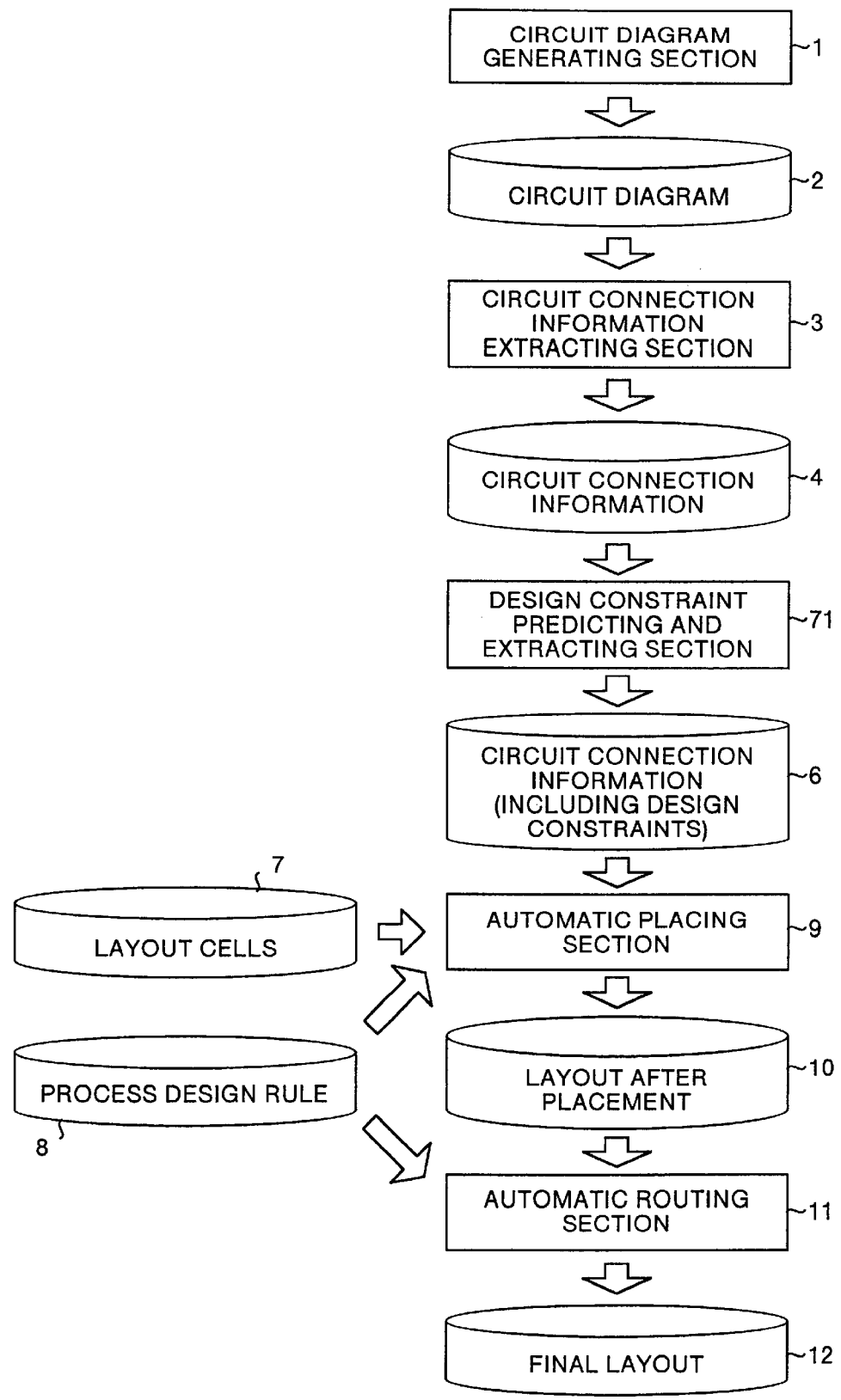
FIG. 13 is a block diagram showing the configuration of an analog cell layout designing apparatus according to a third embodiment of this invention.

FIG. 13 is a block diagram showing the configuration of an analog cell layout designing apparatus according to a third embodiment of this invention. In FIG. 13, the same or corresponding components as those in FIG. 1 are designated by the same reference numerals. The portion related to the third embodiment will be mainly described here.

As shown in FIG. 13, in the third embodiment, in place of the design constraint predicting and extracting section 5 shown in FIG. 1, a design constraint predicting and extracting section 71 is provided. The design constraint predicting and extracting section 71 performs, in addition to the operations of the design constraint predicting and extracting section 5, operations of detecting a resistive element having the lowest resistance value among the resistive elements in the group obtained by coupled the groups in the first embodiment, and rewriting circuit connection information of each of the resistive elements other than the resistive element having the lowest resistance value into information of serial connection of the resistive elements each having the lowest resistance value.

Figure 14:
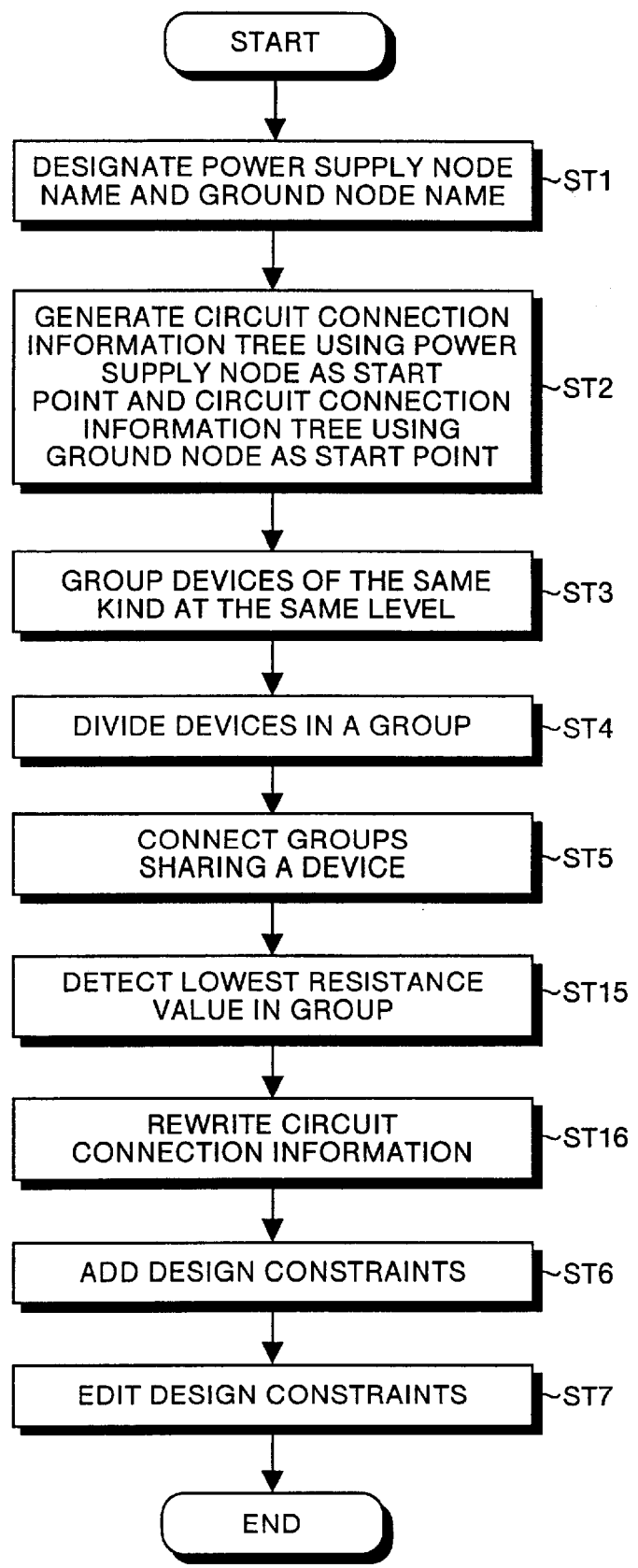
FIG. 14 is a flowchart for explaining the operation of a design constraint predicting and extracting section illustrated in FIG. 13.
Figure 15A:
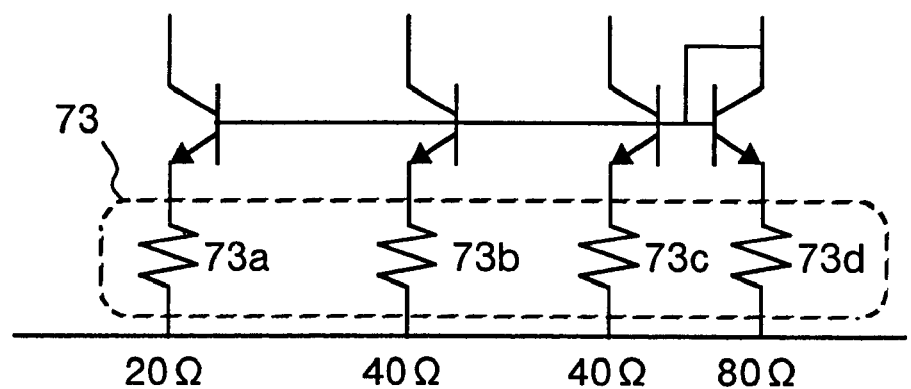
FIGS. 15A and 15B are diagrams showing a state where each of resistive elements in a group is rewritten to serial connection of resistive elements each having the lowest resistance value.
Figure 15B:
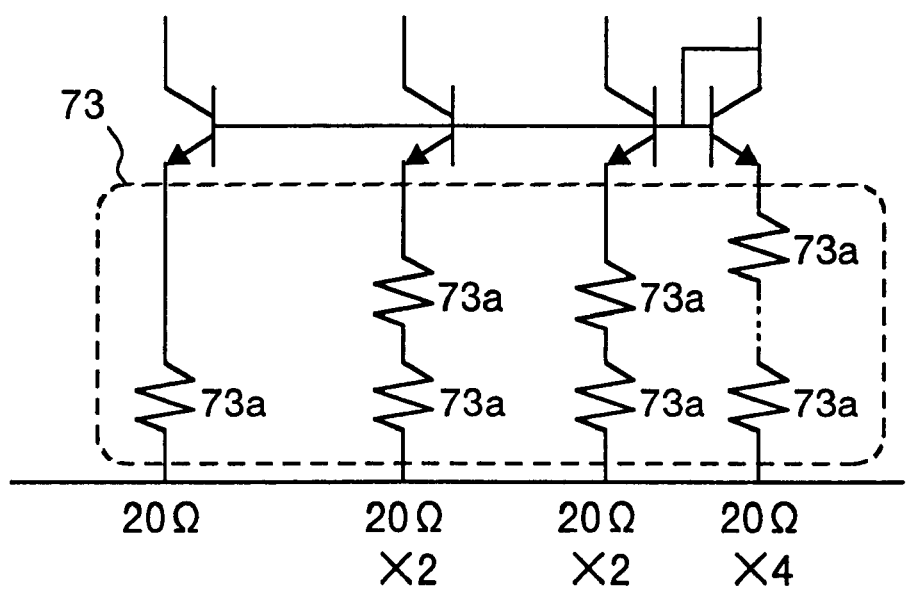

Referring to FIG. 13 to FIGS. 15A and 15B, the operations in the design constraint predicting and extracting section 71 will be concretely described. FIG. 14 is a flowchart for explaining the operation of the design constraint predicting and extracting section 71 shown in FIG. 13. FIGS. 15A and 15B are diagrams showing a state where each of the resistive elements in a group is rewritten to serial connection of resistive elements each having the lowest resistance value.

In FIG. 14, the same processes as those in FIG. 2 are designated by the same reference numerals. The portion related to the third embodiment will be mainly described here. In FIG. 14, in step ST15, the group of the resistive elements is selected from the groups connected in step ST5, the resistive element having the lowest resistance value in the selected group of the resistive elements is detected. In step ST16, in the selected group of the resistive elements, the circuit connection information of the resistive elements other than the resistive element having the lowest resistance value is rewritten to information of serial connection of the resistive elements each having the lowest resistance value. In step ST6, therefore, the device pairing constraints are added to the circuit connection information rewritten as described above.

Referring to FIGS. 15A and 15B, the operation of rewriting the circuit connection information will be concretely described. As shown in FIG. 15A, a group 73 of resistive elements is constructed by four resistive elements 73a, 73b, 73c, and 73d. The resistance values of the four resistive elements 73a, 73b, 73c, and 73d are 20Ω, 40Ω, 40Ω, and 80Ω, respectively. The resistive element 73a has the lowest resistance value.

As shown in FIG. 15B, the resistance element 73a is unchanged, and the resistance value of each of the other resistive elements 73b, 73c, and 73d is rewritten to information of serial connection of the resistive elements 73a. Specifically, the resistance value of each of the resistive elements 73b and 73c is rewritten to 20Ω×2, and the resistance value of the resistive element 73d is rewritten to 20Ω×4. In reality, there is a case such that the resistance value of each of the resistive elements other than the resistive element having the lowest resistance value cannot be rewritten by serial connection of the lowest resistive value. In such a case, the lowest resistance value is repeatedly added as much as possible and the remainder is added to the serial connection information.

As described above, according to the third embodiment, the design constraints using the resistive element having the lowest resistance value as a reference can be predicated. Although an example of applying the third embodiment to the first embodiment has been described above, obviously, the third embodiment can be also similarly applied to the second embodiment.

Figure 16:
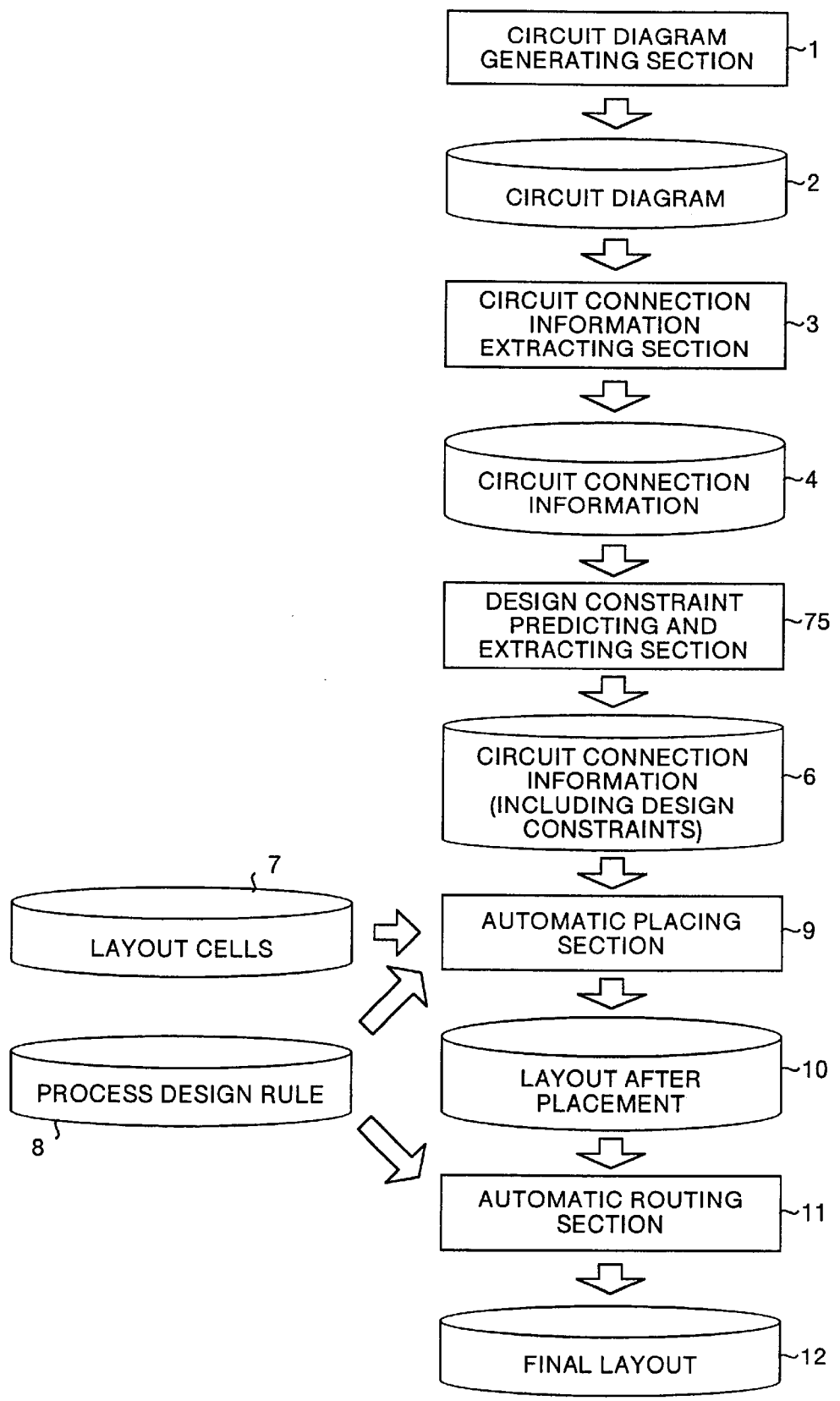
FIG. 16 is a block diagram showing the configuration of an analog cell layout designing apparatus according to a fourth embodiment of this invention.

FIG. 16 is a block diagram showing the configuration of an analog cell layout designing apparatus according to a fourth embodiment of this invention. In FIG. 16, the same or corresponding components as those in FIG. 1 are designated by the same reference numerals. The portion related to the fourth embodiment will be mainly described here.

As shown in FIG. 16, in the fourth embodiment, in place of the design constraint predicting and extracting section 5 shown in FIG. 1, a design constraint predicting and extracting section 75 is provided. The design constraint predicting and extracting section 75 performs, in addition to the operations of the design constraint predicting and extracting section 5, operations of detecting a resistive element having the highest resistance value among a group of resistive elements in the groups coupled in the first embodiment, and rewriting circuit connection information of each of the resistive elements other than the resistive element having the highest resistance value into information of parallel connection of the resistive elements each having the highest resistance value.

Figure 17:
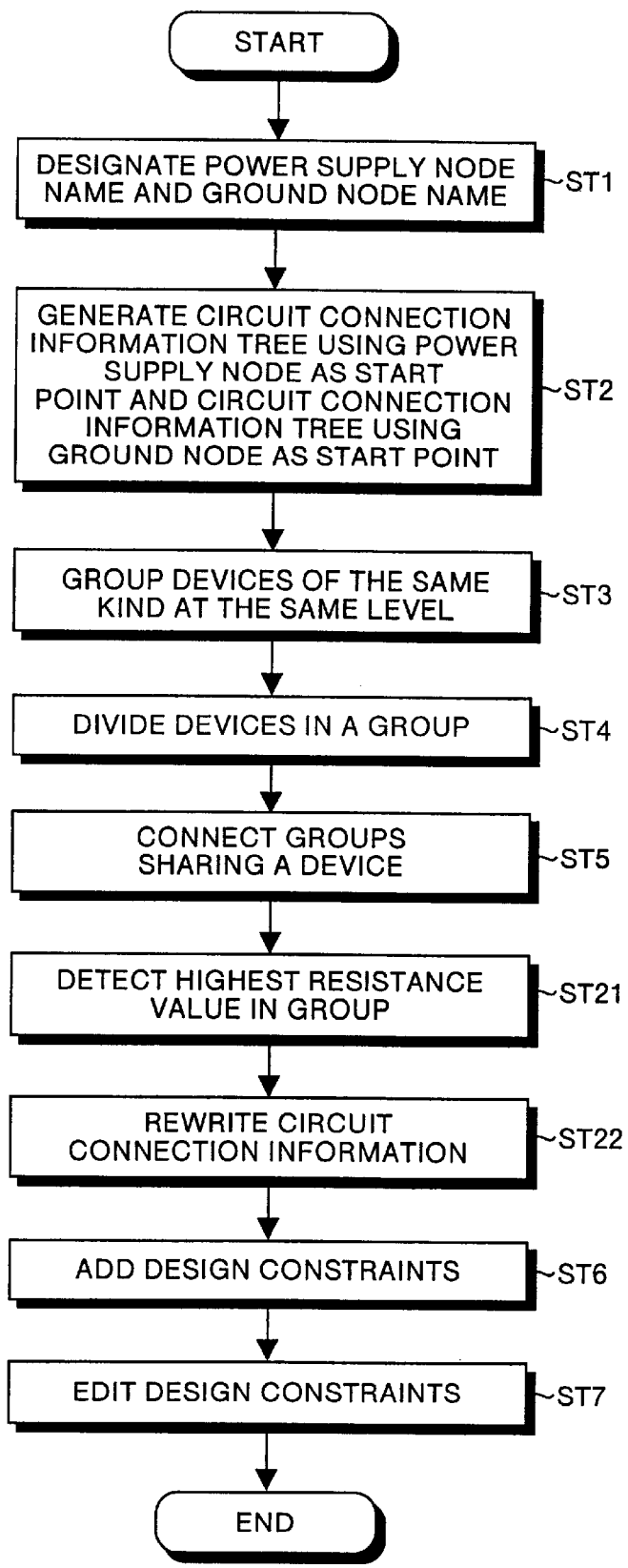
FIG. 17 is a flowchart for explaining the operation of a design constraint predicting and extracting section illustrated in FIG. 16.
Figure 18A:
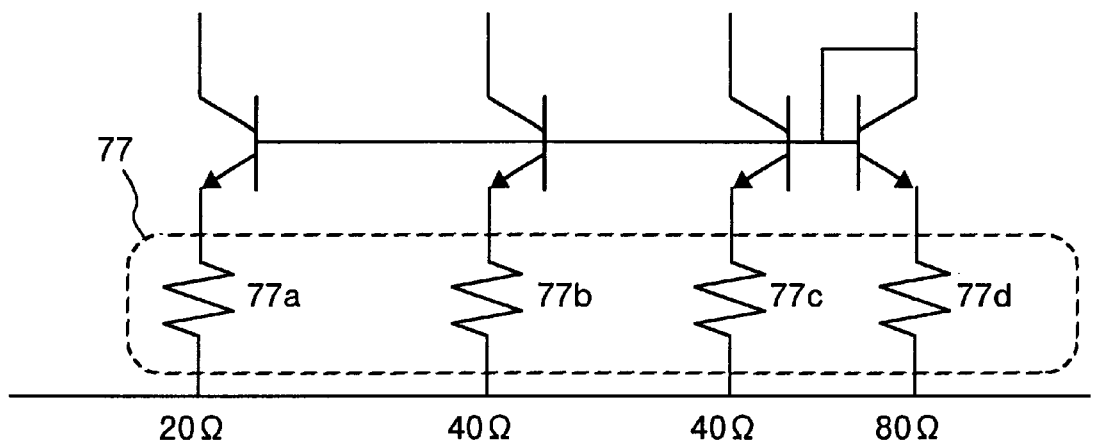
FIGS. 18A and 18B are diagrams each showing a state where each of resistive elements in a group is rewritten to parallel connection of resistive elements each having the highest resistance value.
Figure 18B:
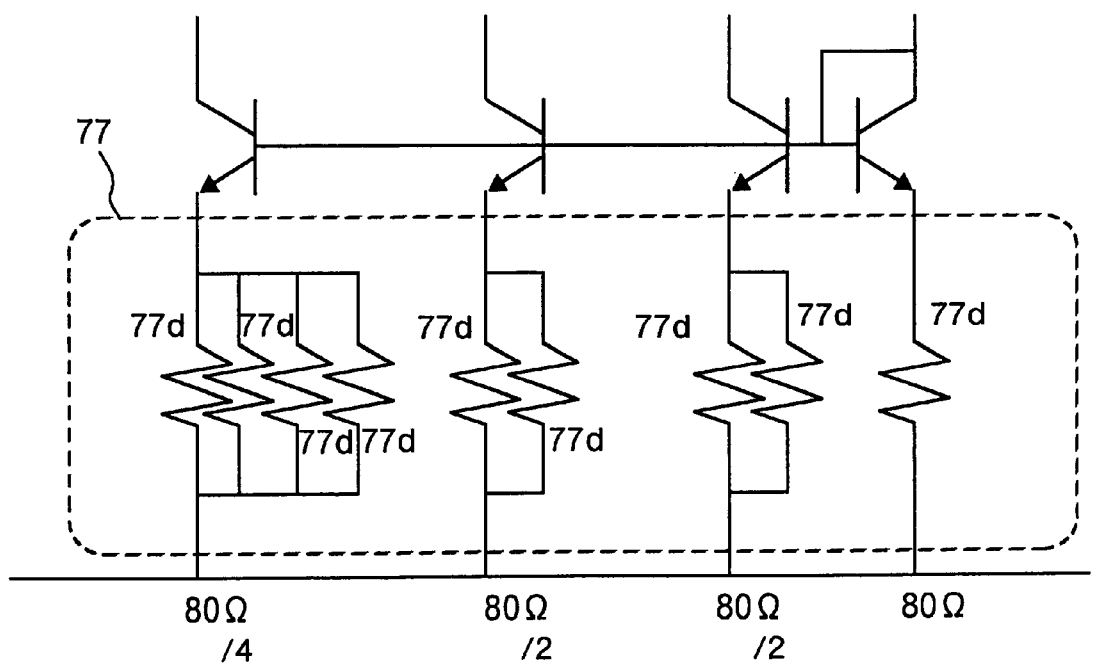

Referring to FIG. 16 to FIGS. 18A and 18B, the operations in the design constraint predicting and extracting section 75 will be concretely described. FIG. 17 is a flowchart for explaining the operation of the design constraint predicting and extracting section 75 shown in FIG. 16. FIGS. 18A and 18B are diagrams showing a state where each of the resistive elements in a group is rewritten to parallel connection of the resistive elements each having the highest resistance value.

In FIG. 17, the same processes as those in FIG. 2 are designated by the same reference numerals. The portion related to the fourth embodiment will be mainly described here. In FIG. 17, in step ST21, a group of the resistive elements is selected from the groups connected in step ST5, the resistive element having the highest resistance value in the selected group of the resistive elements is detected. In step ST22, in the selected group of the resistive elements, the circuit connection information of each of the resistive elements other than the resistive element having the highest resistance value is rewritten to information of parallel connection of the resistive elements each having the highest resistance value. In step ST6, therefore, the device pairing constraints are added to the circuit connection information including the circuit connection information rewritten as described above.

Referring to FIGS. 18A and 18B, the operation of rewriting the circuit connection information will be concretely described. As shown in FIG. 18A, a group 77 of resistive elements is constructed by four resistive elements 77a, 77b, 77c, and 77d. The resistance values of the four resistive elements 77a, 77b, 77c, and 77d are 20Ω, 40Ω, 40Ω, and 80Ω, respectively. The resistive element 77d has the highest resistance value.

As shown in FIG. 18B, the resistive element 77d is unchanged, and the resistance value of each of the other resistive elements 77a, 77b, and 77c is rewritten to parallel connection of the resistive elements 77d. Specifically, the resistance value of each of the resistive elements 77b and 77c is rewritten to 80Ω/2, and the resistance value of the resistive element 77a is rewritten to 80Ω/4. In reality, there is a case such that the resistance value of each of the resistive elements other than the resistive element having the highest resistance value cannot be realized by parallel connection of the resistive elements each having the highest resistive value. In such a case, the parallel connection of the highest resistance value is executed as much as possible and the remainder is added to the parallel connection information.

As described above, according to the fourth embodiment, the design constraints using the resistive element having the highest resistance value as a reference can be predicated. Although an example of applying the fourth embodiment to the first embodiment has been described above, obviously, the fourth embodiment can be also similarly applied to the second embodiment.

FIG. 19 is a block diagram showing the configuration of an analog cell layout designing apparatus according to a fifth embodiment of this invention. In FIG. 19, the same or corresponding components as those in FIG. 1 are designated by the same reference numerals. The portion related to the fifth embodiment will be mainly described here.

As shown in FIG. 19, in the fifth embodiment, in place of the design constraint predicting and extracting section 5 shown in FIG. 1, a design constraint predicting and extracting section 81 is provided. The design constraint predicting and extracting section 81 performs, in addition to the operations of the design constraint predicting and extracting section 5, operations of detecting a bipolar type transistor device having the smallest emitter size in a group of bipolar type transistor devices in the groups coupled in the first embodiment, and rewriting circuit connection information of each of the other bipolar type transistor devices into information of parallel connection of the bipolar type transistor devices each having the smallest emitter size.

Figure 20:
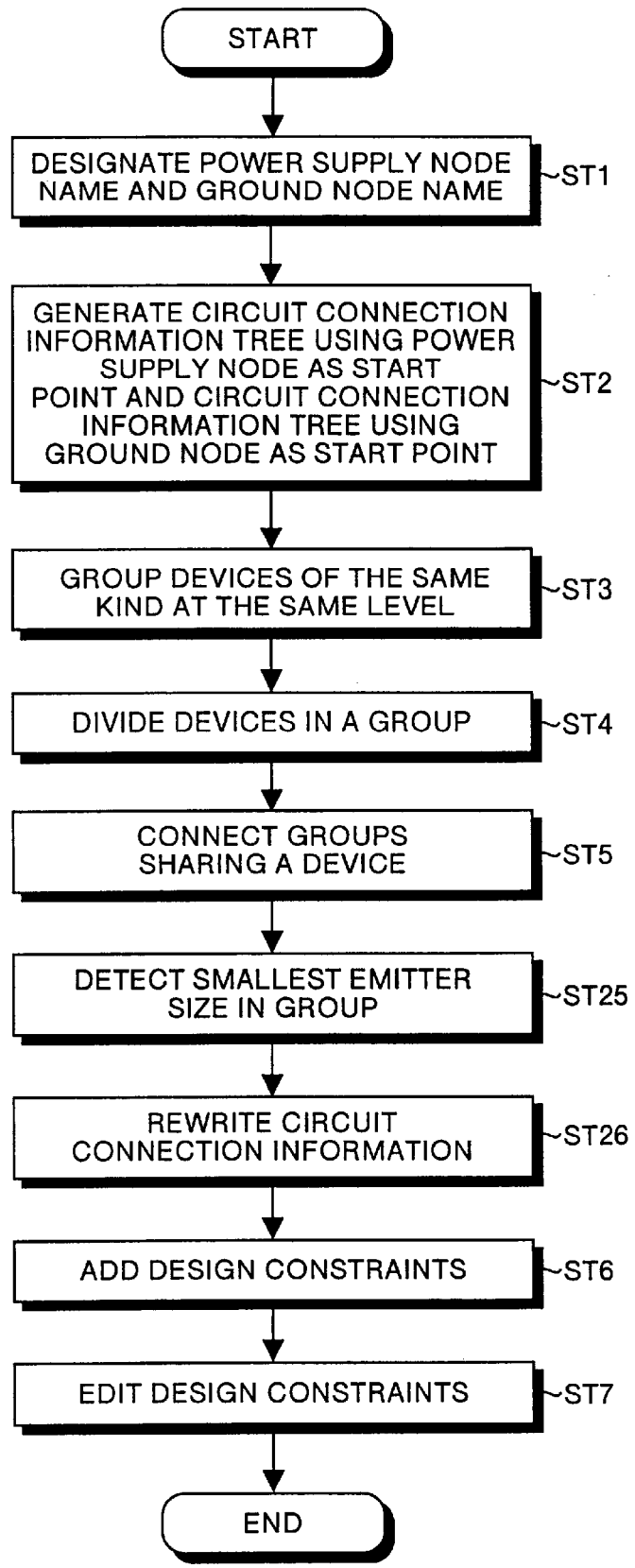
FIG. 20 is a flowchart for explaining the operation of a design constraint predicting and extracting section illustrated in FIG. 19.
Figure 21A:
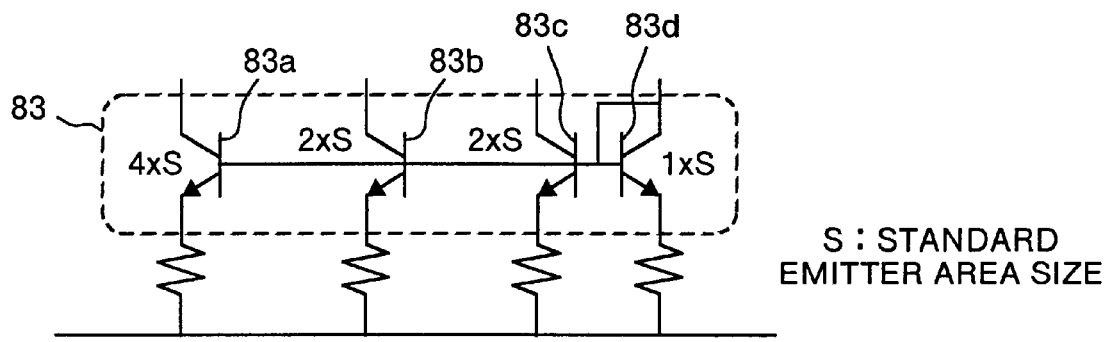
FIGS. 21A and 21B are diagrams showing a state where each of bipolar type transistor devices in a group is rewritten to parallel connection of transistor devices each having the smallest emitter size.
Figure 21B:
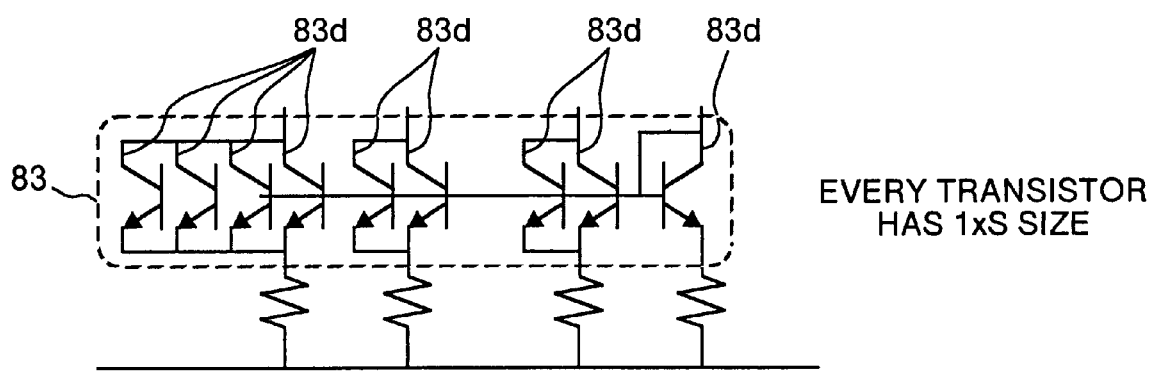

Referring to FIG. 19 to FIGS. 21A and 21B, the operations in the design constraint predicting and extracting section 81 will be concretely described. FIG. 20 is a flowchart for explaining the operations of the design constraint predicting and extracting section 81 shown in FIG. 19. FIGS. 21A and 21B are diagrams showing a state where each of the bipolar type transistor devices in a group is rewritten to parallel connection of the transistor devices each having the smallest emitter size.

In FIG. 20, the same processes as those in FIG. 2 are designated by the same reference numerals. The portion related to the fifth embodiment will be mainly described here. In FIG. 20, in step ST25, a group of the bipolar type transistor devices (PNP, NPN) is selected from the groups connected in step ST5, and the bipolar type transistor device having the smallest emitter size in the selected group of the bipolar type transistor devices is detected. In step ST26, in the selected group of the bipolar type transistor devices, the circuit connection information of each of the bipolar type transistor devices other than the bipolar type transistor device having the smallest emitter size is rewritten to information of parallel connection of the bipolar type transistor devices each having the smallest emitter size. In step ST6, therefore, the device pairing constraints are added to the circuit connection information including the circuit connection information rewritten as described above.

Referring to FIGS. 21A and 21B, the operation of rewriting the circuit connection information will be concretely described. As shown in FIG. 21A, a group 83 of bipolar type transistor devices is constructed by four NPN transistor devices 83a, 83b, 83c, and 83d. When S is a reference emitter size, the emitter size values of the four NPN transistor devices 83a, 83b, 83c, and 83d are 4×S, 2×S, 2×S, and 1×S, respectively. The NPN transistor device 83d has the smallest emitter size value.

As shown in FIG. 21B, the NPN transistor device 83d is unchanged, and each of the other NPN transistor devices 83a, 83b, and 83c is rewritten to parallel connection of the NPN transistor devices 83d. Specifically, the NPN transistor device 83a is rewritten to parallel connection of the four NPN transistor devices 83d. Each of the NPN transistor devices 83b and 83c is rewritten to parallel connection of two NPN transistor devices 83d.

As described above, according to the fifth embodiment, with respect to the bipolar type transistor devices, the design constraints using the bipolar type transistor device having the smallest emitter size value as a reference can be predicated. Although an example of applying the fifth embodiment to the first embodiment has been described above, obviously, the fifth embodiment can be also similarly applied to any of the second to fourth embodiments.

Figure 22:
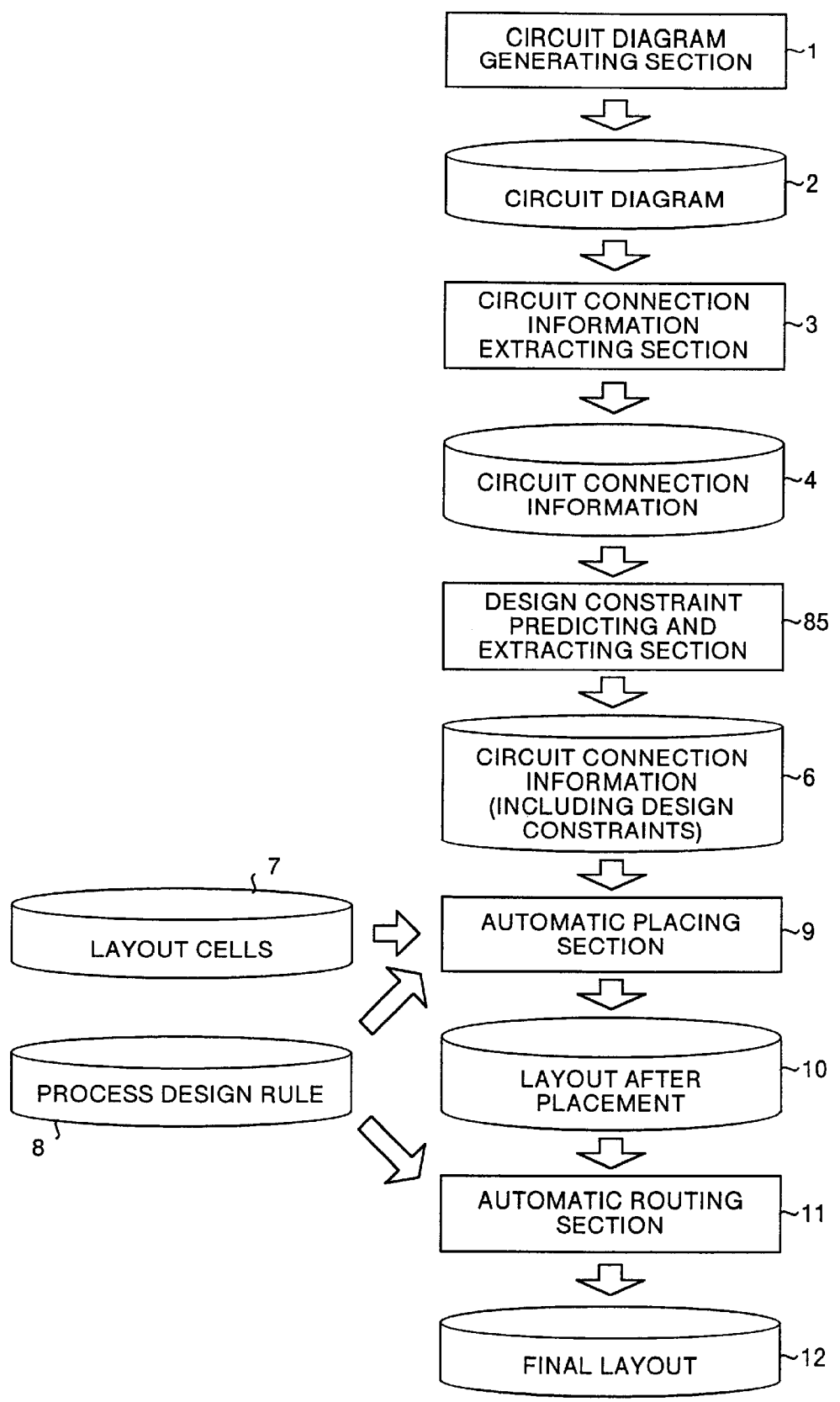
FIG. 22 is a block diagram showing the configuration of an analog cell layout designing apparatus according to a sixth embodiment of this invention.

FIG. 22 is a block diagram showing the configuration of an analog cell layout designing apparatus according to a sixth embodiment of this invention. In FIG. 22, the same or corresponding components as those in FIG. 1 are designated by the same reference numerals. The portion related to the sixth embodiment will be mainly described here.

As shown in FIG. 22, in the sixth embodiment, in place of the design constraint predicting and extracting section 5 shown in FIG. 1, a design constraint predicting and extracting section 85 is provided. The design constraint predicting and extracting section 85 performs, in addition to the operations of the design constraint predicting and extracting section 5, the following two operations which are executed when a group of MOS type transistor devices is used as a group of resistive elements.

First, in a group of MOS type transistor devices in the groups connected in the first embodiment, when the gate lengths of the MOS type transistor devices are equal to each other, an MOS type transistor device having the narrowest gate width is detected, and the circuit connection information of each of the other MOS type transistor devices is rewritten to information of parallel connection of the MOS type transistor devices each having the narrowest gate width.

Second, in a group of MOS type transistor devices in the groups connected in the first embodiment, when the gate widths of the MOS type transistor devices are equal to each other, an MOS type transistor device having the shortest gate length is detected, and the circuit connection information of each of the other MOS type transistor devices is rewritten to information of serial connection of the MOS type transistor devices each having the shortest gate length.

Figure 24A:
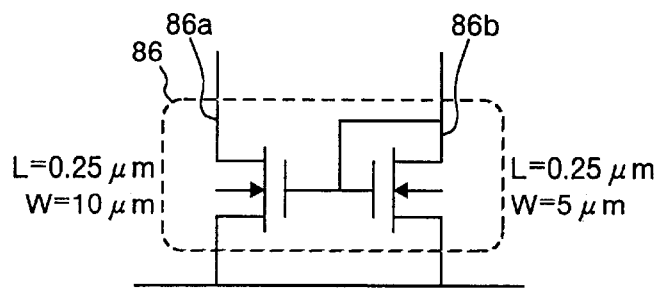
FIGS. 24A and 24B are diagrams showing a state where when MOS type transistor devices in a group have the same gate length, each of the MOS type transistor devices is rewritten to parallel connection of transistor devices each having the narrowest gate width.
Figure 24B:
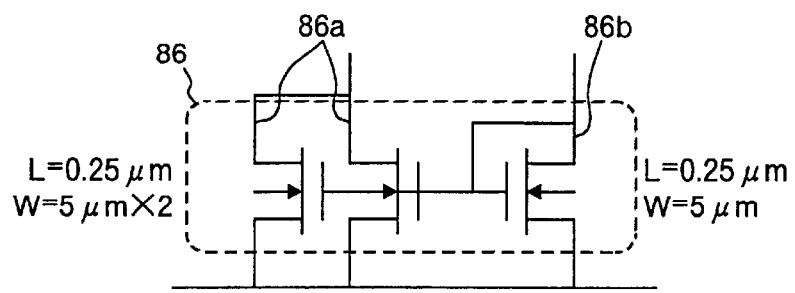
Figure 25A:
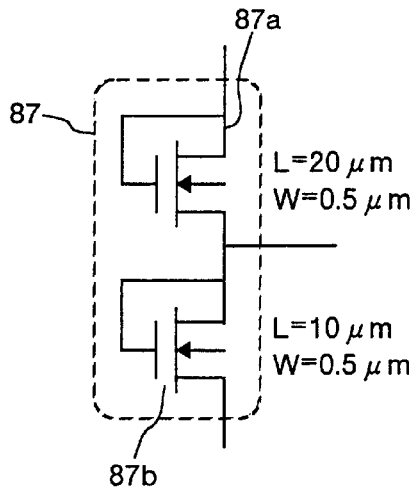
FIGS. 25A and 25B are diagrams showing a state where when MOS type transistor devices in a group have the same gate width, each of the transistors is rewritten to serial connection of transistor devices each having the shortest gate length.
Figure 25B:
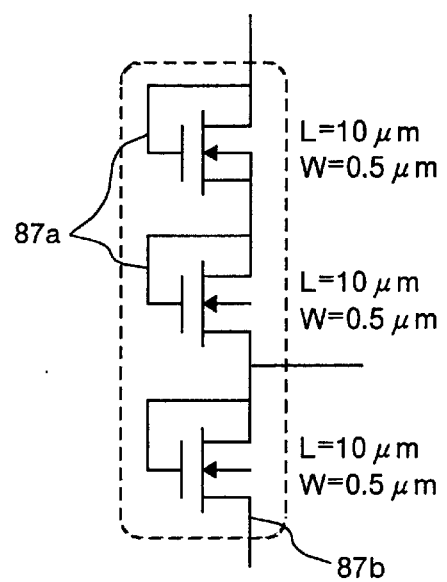

Referring to FIG. 22 to FIGS. 25A and 25B, the operations in the design constraint predicting and extracting section 85 will be concretely described. FIG. 23 is a flowchart for explaining the operation of the design constraint predicting and extracting section shown in FIG. 22. FIGS. 24A and 24B are diagrams showing a state where the gate lengths of MOS transistor devices in a group are equal to each other, and each transistor device is rewritten to parallel connection of the transistor devices each having the narrowest gate width. FIGS. 25A and 25B are diagrams showing a state where MOS transistor devices in a group have the same gate width and each of the transistor devices is rewritten to serial connection of transistor devices each having the shortest gate length.

In FIG. 23, the same processes as those in FIG. 2 are designated by the same reference numerals. The portion related to the sixth embodiment will be mainly described here. In FIG. 23, in step ST31, a group of MOS type transistor devices (PMOS, NMOS) is selected from the groups connected in step ST5, the gate length values of MOS type transistor devices existing in the selected group are detected, and whether the gate length values are equal to each other or not is determined.

When the gate length values of all the MOS type transistor devices existing in the selected group are equal to each other, step ST31 is determined as positive (Yes), and the program advances to step ST32. In step ST32, the MOS transistor device having the smallest gate width value in the MOS type transistor devices existing in the selected group is detected. In step ST33, the circuit connection information of each of the other MOS type transistor devices is rewritten to information of parallel connection of the MOS type transistor devices having the smallest gate width value, and the program advances to step ST6.

When the gate length values of all the MOS type transistor devices existing in the selected group are not equal to each other in step ST31, the determination of step ST31 becomes negative (No), and the program advances to step ST34. In step ST34, the gate width values of the MOS type transistor devices existing in the selected group are detected and whether the detected gate width values are equal to each other or not is determined. When the gate width values of the MOS type transistor devices existing in the selected group are equal to each other (Yes in step ST34), the program advances to step ST35. If No in step ST34, the program advances to step ST6.

In step ST35, the MOS type transistor device having the smallest gate length value in the MOS type transistor devices existing in the selected group is detected. In step ST36, the circuit connection information of each of the other MOS type transistor devices is rewritten to information of serial connection of the MOS type transistor devices each having the smallest gate length value, and the program advances to step ST6. In step ST6, therefore, when the circuit connection information is rewritten as described above, the device pairing constraints are added to the circuit connection information including the rewritten circuit connection information.

Referring to FIGS. 24A and 24B and FIGS. 25A and 25B, the operation of rewriting the circuit connection information will be concretely described. As shown in FIG. 24A, a group 86 of MOS type transistor devices is constructed by two MOS type transistor devices 86a and 86b. The gates and sources of the two MOS type transistor devices are commonly connected, and the gate and drain of the MOS type transistor 86b are connected to each other.

The MOS type transistor device 86a has a gate length L of 0.25 $\mu$m and a gate width W of 10 $\mu$m. The MOS type transistor device 86b has a gate length L of 0.25 $\mu$m and a gate width W of 5 $\mu$m. That is, the gate lengths of the two MOS type transistor devices 86a and 86b are equal to each other. On the other hand, the gate width of the MOS type transistor device 86b is narrower than that of the MOS type transistor device 86a. As shown in FIG. 24B, the MOS type transistor device 86b is unchanged, and the MOS type transistor device 86a is rewritten to parallel connection of the MOS type transistor devices 86b.

In reality, there is a case that each of the other MOS type transistor devices cannot be realized by parallel connection of the MOS type transistor devices each having the narrowest gate width. In this case, the parallel connection of the MOS type transistor devices each having the narrowest gate width is executed as much as possible and the remaining gate width value is added to the parallel connection information.

As shown in FIG. 25A, a group 87 of MOS type transistor devices is constructed by two MOS type transistor devices 87a and 87b. The two MOS type transistor devices 87a and 87b are connected in series, and their gates and drains are connected to each other.

The MOS type transistor device 87a has a gate length L of 20 $\mu$m and a gate width of 0.5 $\mu$m. The MOS type transistor device 87b has a gate length L of 10 $\mu$m and a gate width W of 0.5 $\mu$m. That is, the gate widths of the two MOS type transistor devices 87a and 87b are equal to each other. On the other hand, the gate length of the MOS type transistor device 87b is shorter than that of the MOS type transistor device 87a. Consequently, as shown n FIG. 25B, the MOS type transistor device 87b is unchanged, and the MOS type transistor device 87a is rewritten to serial connection of the MOS type transistor devices 87b.

In reality, there is a case that each of the other MOS type transistor devices cannot be realized by serial connection of the MOS type transistor devices each having the shortest gate length. In this case, the serial connection of the MOS type transistor devices each having the shortest gate length is executed as much as possible and the remaining gate length value is added to the serial connection information.

As described above, according to the sixth embodiment, the design constraints in the case of using the MOS type transistor devices as resistive elements can be predicated from the circuit connection information. Although the example of applying the sixth embodiment to the first embodiment has been described, obviously, the sixth embodiment can be similarly applied to any of the second to fifth embodiments.

Figure 26:
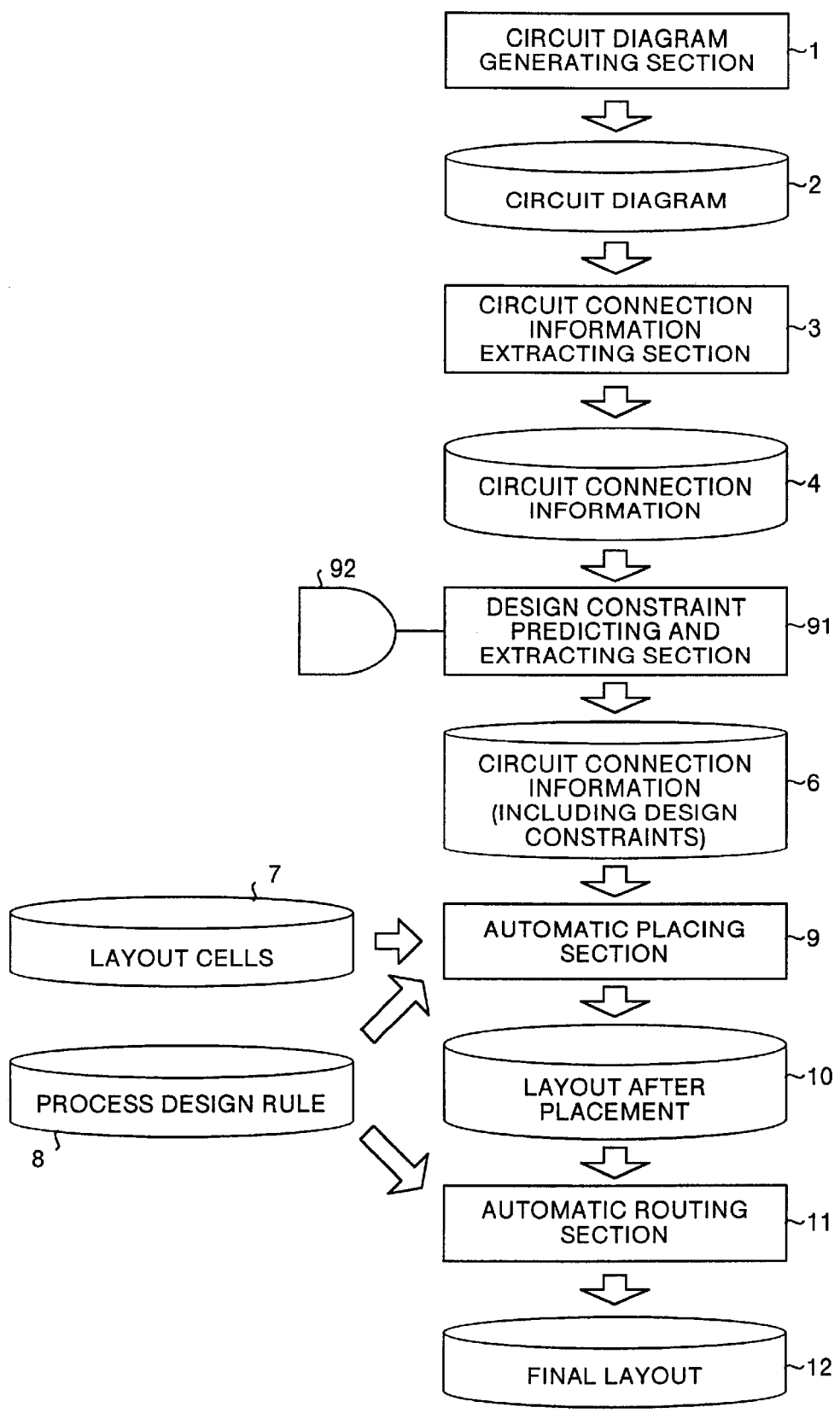
FIG. 26 is a block diagram showing the configuration of an analog cell layout designing apparatus according to a seventh embodiment of this invention.

FIG. 26 is a block diagram showing the configuration of an analog cell layout designing apparatus according to a seventh embodiment of this invention. In FIG. 26, the same or corresponding components as those in FIG. 1 are designated by the same reference numerals. The portion related to the seventh embodiment will be mainly described here.

As shown in FIG. 26, in the seventh embodiment, in place of the design constraint predicting and extracting section 5 shown in FIG. 1, a design constraint predicting and extracting section 91 is provided. The design constraint predicting and extracting section 91 is provided with a display 92. In addition to the operations of the design constraint predicting and extracting section 5, the design constraint predicting and extracting section 91 displays design constraints in an editing process on the display 92 by using different colors for groups.

Figure 27:
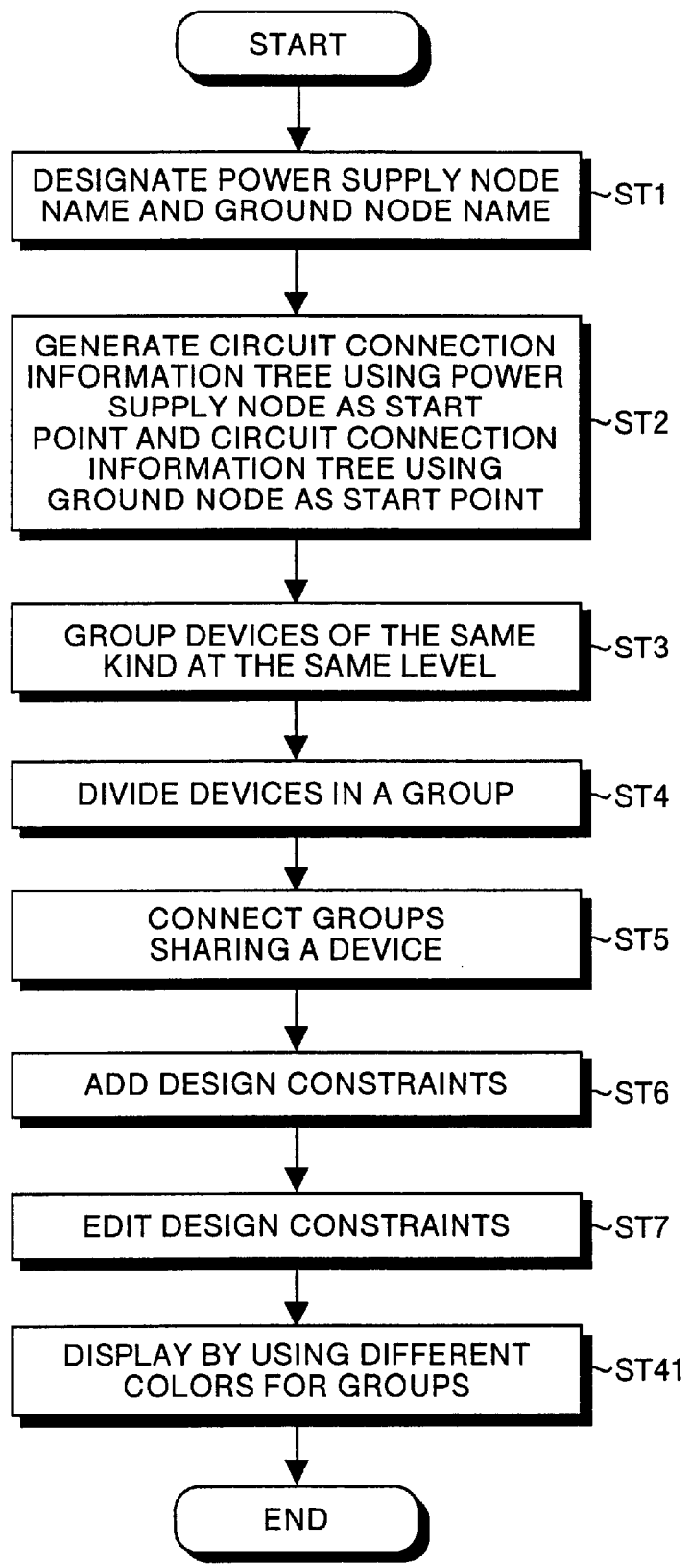
FIG. 27 is a flowchart for explaining the operation of a design constraint predicting and extracting section illustrated in FIG. 26.

Referring to FIG. 27, the operations in the design constraint predicting and extracting section 91 will be concretely described. FIG. 27 is a flowchart for explaining the operation of the design constraint predicting and extracting section shown in FIG. 26. In FIG. 27, the same processes as those in FIG. 2 are designated by the same reference numerals. The portion related to the seventh embodiment will be mainly described here.

In FIG. 27, in step ST41, groups of devices in the circuit connection information to which the design constraints are added in step ST7 are color-coded.

As described above, according to the seventh embodiment, the designer can easily visually recognize the design constraint information, so that the information can be reflected in layout design and the layout designing is facilitated. An example is described in an eighth embodiment. Although the example of applying the seventh embodiment to the first embodiment has been described, obviously, the seventh embodiment can be similarly applied to any of the second to sixth embodiments.

Figure 28:
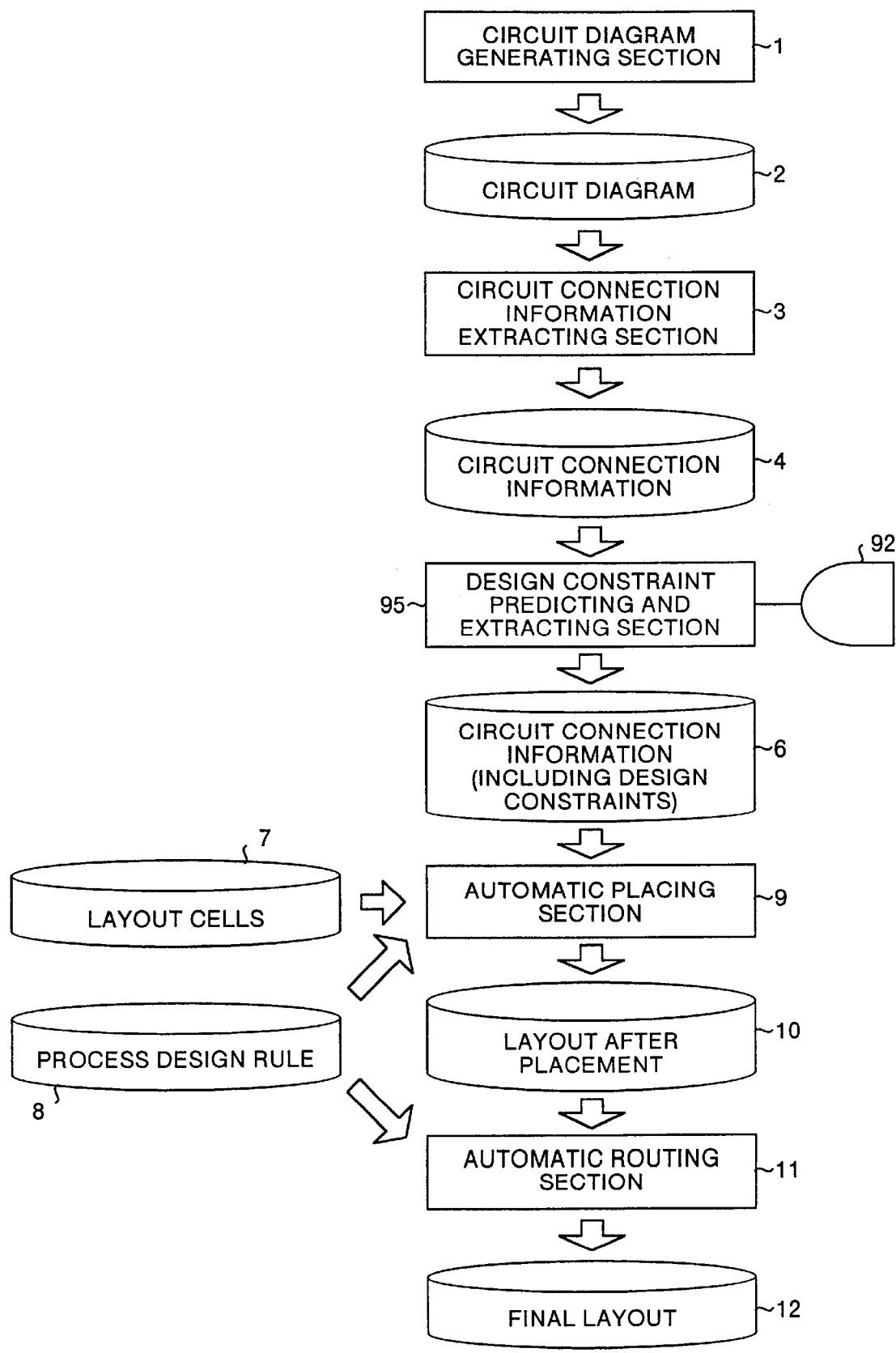
FIG. 28 is a block diagram showing the configuration of an analog cell layout designing apparatus according to an eighth embodiment of this invention.

FIG. 28 is a block diagram showing the configuration of an analog cell layout designing apparatus according to an eighth embodiment of this invention. In FIG. 28, the same or corresponding components as those in FIG. 26 are designated by the same reference numerals. The portion related to the eighth embodiment will be mainly described here.

As shown in FIG. 28, in the eighth embodiment, in place of the design constraint predicting and extracting section 91 shown in FIG. 26, a design constraint predicting and extracting section 95 is provided. In addition to the operations of the design constraint predicting and extracting section 5, the design constraint predicting and extracting section 95 performs the following operation. When the designer sees information displayed on the display 92 and there is designation of a change in connection with respect to a group of resistive elements, in accordance with the designation, the design constraint predicting and extracting section 95 detects a resistive element having the lowest resistance value in each of groups of resistive elements existing in the group as device pairing constraints once edited, rewrites circuit connection information of each of the other resistive elements to information of serial connection of resistive elements each having the lowest resistance value, detects a resistive element having the highest resistance value, and rewrites circuit connection information of each of the other resistive elements to information of parallel connection of the resistive elements each having the highest resistance value.

Figure 29:
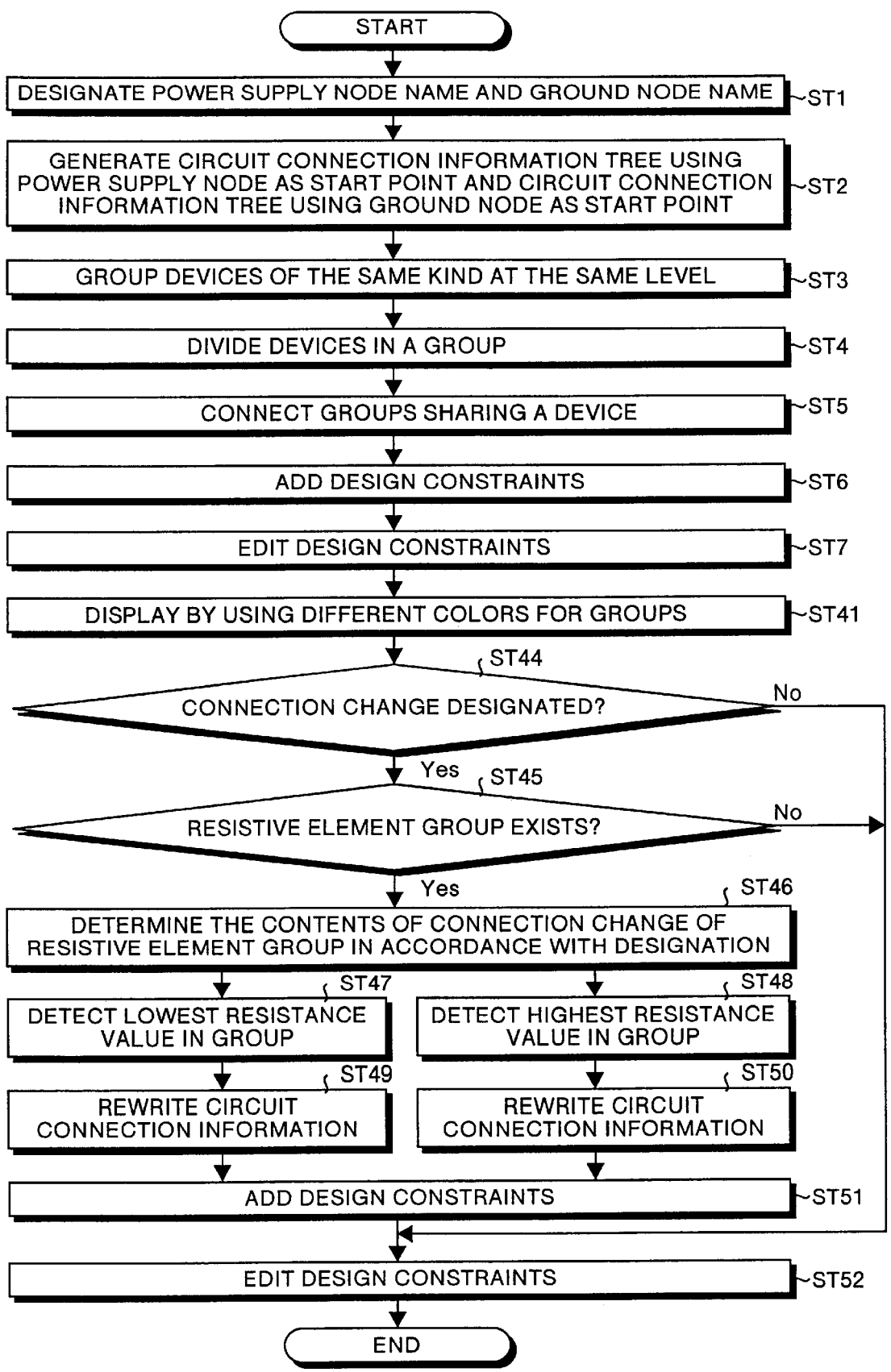
FIG. 29 is a flowchart for explaining the operation of a design constraint predicting and extracting section illustrated in FIG. 28.

Referring now to FIG. 29, the operations in the design constraint predicting and extracting section 95 will be concretely described. FIG. 29 is a flowchart for explaining the operations of the design constraint predicting and extracting section 95 shown in FIG. 28. In FIG. 29, the same processes as those in FIG. 27 are designated by the same reference numerals. The portion related to the eighth embodiment will be mainly described here.

In FIG. 29, in step ST44, whether or not a connection change is designated for the resistive element group displayed on the display 92 in a process of step ST41 is determined. When there is no designation, step ST44 is determined as negative (No) and the process advances to step ST52. When there is a designation, step ST44 is determined as positive (Yes), and the program advances to step ST45.

In step ST45, whether the resistive element group exists in the circuit connection information edited in step ST7 or not is determined. When the resistive element group does not exist, step ST45 is determined as negative (No) and the program advances to step ST52. When the resistive element group exists, step ST45 is determined as positive (Yes), and the program advances to step ST46. In step ST46, the contents of the designation of the designer detected in step ST44 are determined and, according to the determination, the program advances to either step ST47 or ST48.

In step ST47, in each group of resistive elements existing in the group as edited device paring constraints, the resistive element having the lowest resistance value is detected and the program advances to step ST49. In step ST49, the circuit connection information of each of the resistive elements other than the resistive element having the lowest resistance value is rewritten to information of serial connection of the resistive elements each having the lowest resistance value, and the program advances to step ST51.

On the other hand, in step ST48, in each group of resistive elements existing in the group as edited device paring constraints, the resistive element having the highest resistance value is detected and the program advances to step ST50. In step ST50, in the resistive element group, the circuit connection information of each of the resistive elements other than the resistive element having the highest resistance value is rewritten to information of parallel connection of the resistive elements each having the highest resistance value, and the program advances to step ST51.

In step ST51, the circuit connection information rewritten as described above is added to the circuit connection information read from the circuit connection information storing section 4. In step ST52, the design constraints are newly edited, and the circuit connection information to which the edited design constraints are added is written to the circuit connection information storing section 6.

As described above, according to the eighth embodiment, in the design constraints once edited, with respect to the resistive element group, the designer can arbitrarily select, rewriting of the circuit connection information of each of the resistive elements other than the resistive element having the lowest resistance value to the serial connection information of the resistive elements each having the lowest resistive value, or rewriting of the circuit connection information of the resistive elements other than the resistive element having the highest resistance value to the parallel connection information of the resistive elements each having the highest resistance value. Therefore, in the case of automatically designing the layout of the analog circuit, the layout can be easily edited to the circuit connection information by which resistive elements can be easily placed.

The various steps involved in the method according to this invention may be realized on a computer by writing a computer program and executing this computer program on the computer. The computer program may be stored on a computer readable recording medium such as floppy disk, CD ROMs, or computer hard disks, and the computer is made to read the computer program from these recording medium. Alternately, the computer program may be made available over the Internet for download.

As described above, according to one aspect of this invention, circuit diagram data of an analog circuit diagram is generated by the circuit diagram generating unit and is written and stored into the circuit diagram storing unit. When circuit connection information is extracted by the circuit connection information extracting unit from the analog circuit diagram data stored in the circuit diagram storing unit, it is written and stored in the first circuit connection information storing unit. When devices to be paired are predicted and extracted from the circuit connection information stored in the first circuit connection information storing unit and added as design constraints to the circuit connection information, the resultant is written and stored in the second circuit connection information storing unit. As a result, in the automatic placing unit, layout cells are selected on the basis of the circuit connection information including the design constraints, stored in the second circuit connection information storing unit and placed in accordance with a process design rule. The layout cells placed by the automatic placing unit are routed in accordance with the process design rule by the automatic routing unit. As described above, at a stage before the circuit connection information is supplied to the automatic placing unit, devices to be paired are predicted and extracted from the circuit connection information and added as design constraints to the circuit connection information which can be supplied to the automatic placing unit. Therefore, the uniform design constraints which do not depend on the skill of the designer can be added and the precision of layout designing can be consequently increased. Since the designer does not have to set all the design constraints, the trouble of setting the design constraints of the designer can be reduced, and the layout designing can be facilitated.

Moreover, when a node name is given by the node name giving unit to a power supply line and a ground line in the circuit connection information stored in the first circuit connection information storing unit, circuit connection information tree generating unit generates a circuit connection information tree using the power supply line to which the node name is given as a start point and indicative of a connection relation of P-type transistor devices and a connection relation of resistive elements, and a circuit connection information tree using the ground line to which the node name is given as a start point and indicative of a connection relation of N-type transistor devices and a connection relation of resistive elements. As a result, the grouping unit groups devices of the same kind at the same level in each of the circuit connection information trees generated. The group dividing unit divides a group by selecting devices connected to the same line other than the power supply line or selecting devices connected to the same line other than the ground line from the devices in each of groups formed by the grouping unit. Subsequently, the group coupling unit couples groups sharing a device in the groups formed by the group dividing unit. The design constraint adding unit adds the formed groups as pairing constraints to the circuit connection information. The editing unit edits the device paring constraints added by the design constraint adding unit and writes the resultant to the second circuit connection information storing unit. As described above, the design constraints are automatically predicted from the circuit connection information and extracted. The extracted design constraints can be added to the circuit connection information.

Furthermore, when the node name giving unit gives a node name to a power supply line and a ground line in the circuit connection information stored in the first circuit connection information storing unit, the circuit connection information tree generating unit generates a circuit connection information tree using the power supply line to which the node name is given as a start point and indicative of a connection relation of P-type transistor devices and a connection relation of resistive elements, and a circuit connection information tree using the ground line to which the node name is given as a start point and indicative of a connection relation of N-type transistor devices and a connection relation of resistive elements. The grouping unit groups devices of the same kind at the same level in each of the circuit connection information trees generated. The group dividing unit divides a group by selecting devices connected to the same line other than the power supply line or selecting devices connected to the same line other than the ground line from the devices in each of groups formed by the grouping unit. When a branch extending from the power supply line to the ground line and a branch extending from the ground line to the power supply line exist in the circuit connection information trees generated, the branch device grouping unit groups all devices of the same kind existing in each of the branches. Subsequently, the group coupling unit couples groups sharing a device in groups formed by the group dividing unit and groups formed by the branch device grouping unit. The design constraint adding unit adds the groups formed by the group dividing unit and the groups formed by the branch device grouping unit as pairing constraints to the circuit connection information. The editing unit edits the device paring constraint added by the design constraint adding unit and writes the resultant to the second circuit connection information storing unit. Therefore, since the groups of branch devices existing between the power supply line and the ground line can be also made objects, the larger number of design constraints can be predicted.

Moreover, in the circuit connection information rewriting unit, in a group of the resistive elements in the groups coupled by the group coupling unit, a resistive element having the lowest resistance value is detected, and circuit connection information of each of the resistive elements other than the resistive element having the lowest resistance value to information of serial connection of the resistive elements each having the lowest resistance value. The design constraint adding unit adds the device paring constraint to the circuit connection information including the circuit connection information rewritten by the circuit connection information rewriting unit. Thus, the design constraint using the resistive element having the lowest resistance value as a reference can be predicted.

Furthermore, in the circuit connection information rewriting unit, in a group of the resistive elements in the groups formed by the group coupling unit, a resistive element having the highest resistance value is detected and circuit connection information of each of the resistive elements other than the resistive element having the highest resistance value is rewritten to information of parallel connection of resistive elements each having the highest resistance value. The design constraint adding unit adds the device paring constraint to the circuit connection information including the circuit connection information rewritten by the circuit connection information rewriting unit. Thus, the design constraint using the resistive element having the highest resistance value as a reference can be predicted.

Moreover, in the design constraint predicting and extracting unit, by the circuit connection information rewriting unit, in a group of bipolar type transistor devices in the groups formed by the group coupling unit, circuit connection information of each of bipolar type transistor devices other than a bipolar type transistor device having the smallest emitter size is rewritten to information of parallel connection of the bipolar type transistor devices each having the smallest emitter size value. The design constraint adding unit adds the device paring constraint to the circuit connection information including the circuit connection information rewritten by the circuit connection information rewriting unit. Thus, the design constraint using the bipolar type transistor device having the smallest emitter size value as a reference can be predicted.

Furthermore, in the design constraint predicting and extracting unit, by the circuit connection information rewriting unit, in a group of the MOS type transistor devices in the groups formed by the group coupling unit, rewriting of circuit connection information of each of MOS type transistors other than an MOS type transistor device having the smallest gate width value to information of parallel connection of MOS type transistor devices each having the smallest gate width value when gate lengths of the MOS type transistor devices are equal to each other, and/or rewriting of circuit connection information of each of MOS type transistors other than an MOS type transistor device having the smallest gate length value to information of serial connection of MOS type transistor devices each having the smallest gate length value when gate widths of the MOS type transistor devices are equal to each other is performed. The design constraint adding unit adds the device paring constraint to the circuit connection information including the circuit connection information rewritten by the circuit connection information rewriting unit. Thus, the design constraint using the MOS type transistor device as a resistive element can be predicted from the circuit connection information.

Moreover, in the design constraint predicting and extracting unit, the device pairing constraints edited by the editing unit are displayed by the display unit by using different colors for the groups. The designer can easily visually recognize the design constraint information, so that the information can be reflected in layout design and the layout designing is facilitated.

Furthermore, to prepare a case such that the designer sees information displayed on the display unit in the invention and designates a connection change for a group of resistive elements, the determining unit determines whether or not a connection change is designated for a group of resistive elements after completion of an editing unit by the editing unit. When the connection change is designated, in accordance with the contents of the designation, rewriting of circuit connection information of each of resistive elements other than the resistive element having the lowest resistance value to information of serial connection of the resistive elements each having the lowest resistance value, or rewriting of circuit connection information of each of resistive elements other than the resistive element having the highest resistance value to information of parallel connection of resistive elements each having the highest resistance value is selectively executed every group with respect to resistive element groups existing in groups as the device pairing constraints edited by the editing unit. As described above, with respect to the resistive element group in design constraints once edited, the designer can arbitrarily select the rewriting of circuit connection information of each of the resistive elements other than the resistive element having the lowest resistance value to information of serial connection of resistive elements each having the lowest resistance value and the rewriting of circuit connection information of each of the resistive elements other than the resistive element having the highest resistance value to information of parallel connection of the resistive elements each having the highest resistance value. Thus, in the case of automatically designing the layout from an analog circuit, circuit connection information by which resistive elements can be easily placed can be easily edited.

Furthermore, when circuit diagram data corresponding to the analog circuit diagram is generated in the circuit diagram generating step, it is written and stored into the circuit diagram storing unit. In the circuit connection information extracting step, circuit connection information is extracted from the analog circuit diagram data stored in the circuit diagram storing unit and is written and stored into the first circuit connection information storing unit. In the design constraint predicting and extracting step, devices to be paired are predicted and extracted from the circuit connection information stored in the first circuit connection information storing unit and the extracted devices to be paired are added as design constraints to the circuit connection information. The resultant is written and stored into the second circuit connection information storing unit. In the automatic placing step, layout cells are selected on the basis of the circuit connection information including the design constraints stored in the second circuit connection information storing unit and placed in accordance with a process design rule. In the automatic routing step, the layout cells placed in the automatic placing step are routed in accordance with the process design rule. As described above, at a stage before the circuit connection information is supplied to the automatic placing unit, devices to be paired are predicted and extracted from the circuit connection information and added as design constraints to the circuit connection information which can be supplied to the automatic placing unit. Therefore, the uniform design constraints which do not depend on the skill of the designer can be added and the precision of layout designing can be consequently increased. Since the designer does not have to set all the design constraints, the trouble of setting the design constraints of the designer can be reduced, and the layout designing can be facilitated.

Moreover, according to another aspect of this invention, in the design constraint predicting and extracting step, in the node name giving step, a node name is given to a power supply line and a ground line in the circuit connection information stored in the first circuit connection information storing unit. In the circuit connection information tree generating step, a circuit connection information tree using the power supply line to which the node name is given as a start point and indicative of a connection relation of P-type transistor devices and a connection relation of resistive elements, and a circuit connection tree using the ground line to which the node name is given as a start point and indicative of a connection relation of N-type transistor devices and a connection relation of resistive elements are generated. In the grouping step, devices of the same kind at the same level in each of the circuit connection information trees generated are grouped. In the group dividing step, a group is divided by selecting devices connected to the same line other than the power supply line or selecting devices connected to the same line other than the ground line from the devices in each of groups formed in the grouping step. Subsequently, in the group coupling step, groups sharing a device are coupled in the groups formed in the group dividing step. In the design constraint adding step, the groups formed in the group dividing step are added as a pairing constraint to the circuit connection information. In the editing step, the device paring constraint added in the design constraint adding step are edited and written into the second circuit connection information storing unit. As described above, the design constraints can be automatically predicted from the circuit connection information, extracted, and added to the circuit connection information.

Moreover, in the design constraint predicting and extracting step, in the node name giving step, a node name is given to a power supply line and a ground line in the circuit connection information stored in the first circuit connection information storing unit. In the circuit connection information tree generating step, a circuit connection information tree using the power supply line to which the node name is given as a start point and indicative of a connection relation of P-type transistor devices and a connection relation of resistive elements, and a circuit connection tree using the ground line to which the node name is given as a start point and indicative of a connection relation of N-type transistor devices and a connection relation of resistive elements are generated. In the grouping step, devices of the same kind at the same level in each of the circuit connection information trees generated are grouped. In the group dividing step, a group is divided by selecting devices connected to the same line other than the power supply line or selecting devices connected to the same line other than the ground line from the devices in each of groups formed in the grouping step. In the branch device grouping step, when a branch extending from the power supply line to the ground line and a branch extending from the ground line to the power supply line exist in each of the circuit connection information trees generated, all the devices of the same kind existing in each of the branches are grouped. In the group coupling step, groups sharing a device are coupled in groups formed in the group dividing step and groups formed in the branch device grouping step. In the design constraint adding step, the groups formed in the group dividing step and the groups formed in the branch device grouping step are added as device pairing constraints to the circuit connection information. In the editing step, the device paring constraint added in the design constraint adding step are edited and written into the second circuit connection information storing unit. Therefore, the branch device groups existing between the power supply line and the ground line can be also made objects, so that the larger number of design constraints can be predicted.

Furthermore, in the design constraint predicting and extracting step, by the circuit connection information rewriting step, circuit connection information of each of the resistive elements other than the resistive element having the lowest resistance value is rewritten to information of serial connection of resistive elements each having the lowest resistance value in a resistive element group in the groups formed in the group coupling step. In the design constraint adding step, the device paring constraint is added to the circuit connection information including the circuit connection information rewritten in the circuit connection information rewriting step. Thus, the design constraint by using the resistive element having the lowest resistance value as a reference can be predicted.

Moreover, in the design constraint predicting and extracting step, in the circuit connection information rewriting step, in a resistive element group in the groups formed in the group coupling step, a resistive element having the highest resistance value is detected, and circuit connection information of each of the resistive elements other than the resistive element having the highest resistance value is rewritten to information of parallel connection of resistive elements each having the highest resistance value. In the design constraint adding step, the device paring constraint is added to the circuit connection information including the circuit connection information rewritten in the circuit connection information rewriting step. Thus, the design constraint by using the resistive element having the highest resistance value as a reference can be predicted.

Furthermore, in the design constraint predicting and extracting step, in the circuit connection information rewriting step, in a group of bipolar type transistor devices in the groups formed in the group coupling step, circuit connection information of each of bipolar type transistor devices other than a bipolar type transistor device having the smallest emitter size value is rewritten to information of parallel connection of the bipolar type transistor devices each having the smallest emitter size value. In the design constraint adding step, the device paring constraint is added to the circuit connection information including the circuit connection information rewritten in the circuit connection information rewriting step. Thus, the design constraint by using the bipolar type transistor device having the smallest emitter size value as a reference can be predicted.

Moreover, in the design constraint predicting and extracting step, in the circuit connection information rewriting step, in a MOS type transistor device group in the groups formed in the group coupling step, rewriting of circuit connection information of each of MOS type transistors other than an MOS type transistor device having the smallest gate width value to information of parallel connection of MOS type transistor devices each having the smallest gate width value when gate lengths of the MOS type transistor devices are equal to each other and/or rewriting of circuit connection information of each of MOS type transistors other than an MOS type transistor device having the smallest gate length value to information of serial connection of MOS type transistor devices each having the smallest gate length value when gate widths of the MOS type transistor devices are equal to each other is performed. In the design constraint adding step, the device paring constraint is added to the circuit connection information including the circuit connection information rewritten in the circuit connection information rewriting step. Thus, the design constraint in the case where a MOS type transistor device is used as a resistive element can be predicted from the circuit connection information.

Furthermore, in the design constraint predicting and extracting step, in the displaying step, the device pairing constraints edited in the editing unit are displayed by using different colors for groups. Therefore, the designer can visually recognize information of the design constraint predicted from the circuit connection information and extracted, so that the information can be reflected in the layout design and the layout designing can be facilitated.

Moreover, in the design constraint predicting and extracting step, to prepare a case such that the designer sees information displayed on the display unit in the invention and designates a connection change for a group of resistive elements, the determining unit determines whether or not a connection change is designated for a group of resistive elements after completion of an editing unit by the editing unit. When the connection change is designated, in accordance with the contents of the designation, rewriting of circuit connection information of each of resistive elements other than the resistive element having the lowest resistance value to information of serial connection of the resistive elements each having the lowest resistance value, or rewriting of circuit connection information of each of resistive elements other than the resistive element having the highest resistance value to information of parallel connection of resistive elements each having the highest resistance value is selectively executed every group with respect to resistive element groups existing in groups as the device pairing constraints edited by the editing unit. As described above, in the design constraints once edited, with respect to the resistive element group, the designer can arbitrarily select, rewriting of the circuit connection information of each of the resistive elements other than the resistive element having the lowest resistance value to the serial connection information of the resistive elements each having the lowest resistive value, or rewriting of the circuit connection information of the resistive elements other than the resistive element having the highest resistance value to the parallel connection information of the resistive elements each having the highest resistance value. Therefore, in the case of automatically designing the layout of the analog circuit, the layout can be easily edited to the circuit connection information by which resistive elements can be easily placed.

The computer readable recording medium according to still another aspect of this invention stores a computer program which when executed on a computer easily realizes the method according to the present invention on the computer. Thus, the method according to the present invention can be executed easily and automatically.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An analog cell layout designing apparatus comprising:
   a circuit diagram generating unit which generates an analog circuit diagram;
   a circuit diagram storing unit which stores circuit diagram data corresponding to the analog circuit diagram generated by said circuit diagram generating unit;
   a circuit connection information extracting unit which extracts circuit connection information from the analog circuit diagram data stored in said circuit diagram storing unit;
   a first circuit connection information storing unit which stores circuit connection information extracted by said circuit connection information extracting unit;
   a design constraint predicting and extracting unit which predicts and extracts devices to be paired from the circuit connection information stored in said first circuit connection information storing unit and adding the devices extracted as design constraints to the circuit connection information;
   a second circuit connection information storing unit which stores the circuit connection information to which the design constraints are added by said design constraint predicting and extracting unit;
   an automatic placing unit which places layout cells selected based on the circuit connection information including the design constraints, stored in said second circuit connection information storing unit in accordance with a process design rule; and
   an automatic routing unit which conducts routing of the layout cells placed by said automatic placing unit in accordance with the process design rule.

2. The analog cell layout designing apparatus according to claim 1, wherein said design constraints predicting and extracting unit comprises:
   a node name giving unit which gives a node name to a power supply line and a ground line in the circuit connection information stored in said first circuit connection information storing unit;
   a circuit connection information tree generating unit which generates a circuit connection information tree using the power supply line to which the node name is given as a start point and indicative of a connection relation of P-type transistor devices and a connection relation of resistive elements, and generates a circuit connection information tree using the ground line to which the node name is given as a start point and indicative of a connection relation of N-type transistor devices and a connection relation of resistive elements;
   a grouping unit which groups devices of the same kind at the same level in each of the circuit connection information trees generated;
   a group dividing unit which divides a group by selecting devices connected to the same line, other than the power supply line, or selecting devices connected to the same line, other than the ground line, from the devices in each of groups formed by said grouping unit;
   a group coupling unit which couples groups sharing a device in the groups formed by said group dividing unit;
   a design constraint adding unit which adds the groups formed by said group dividing unit, as pairing constraints, to the circuit connection information; and
   an editing unit which edits the device pairing constraints added by said design constraint adding unit and writes the device pairing constraints after editing into said second circuit connection information storing unit.

3. The analog cell layout designing apparatus according to claim 2, wherein said design constraint predicting and extracting unit further comprises a circuit connection information rewriting unit which rewrites circuit connection information of each of the resistive elements, other than the resistive element having the lowest resistance, to information of serial connection of the resistive elements, each having the lowest resistance in a group of the resistive elements in the groups coupled by said group coupling unit, wherein said design constraint adding unit adds the device pairing constraint to the circuit connection information, including the circuit connection information rewritten by said circuit connection information rewriting unit.

4. The analog cell layout designing apparatus according to claim 2, wherein
   said design constraint predicting and extracting unit further comprises a circuit connection information rewriting unit which rewrites circuit connection information of each of bipolar transistor devices, other than a bipolar transistor device having the smallest emitter size in a group of bipolar transistor devices in the groups formed by said group coupling unit, to information of parallel connection of the bipolar transistor devices each having the smallest emitter size, and
   said design constraint adding unit adds the device pairing constraint to the circuit connection information, including the circuit connection information rewritten by said circuit connection information rewriting unit.

5. The analog cell layout designing apparatus according to claim 2, wherein said design constraint predicting and extracting unit further comprises a circuit connection information rewriting unit, and said circuit connection information rewriting unit performs at least one of,
   rewriting of circuit connection information of each of MOS transistors, other than an MOS transistor device having the smallest gate width, to information of parallel connection of MOS transistor devices, each having the smallest gate width, when gate lengths of the MOS transistor devices are equal to each other, in a group of the MOS transistor devices in the groups formed by said group coupling unit; and rewriting of circuit connection information of each of the MOS transistors, other than the MOS transistor device having the smallest gate length, to information of serial connection of MOS transistor devices each having the smallest gate length when gate widths of the MOS transistor devices are equal to each other, wherein said design constraint adding unit adds said device pairing constraint to the circuit connection information, including the circuit connection information rewritten by said circuit connection information rewriting unit.

6. The analog cell layout designing apparatus according to claim 1, wherein said design constraint predicting and extracting unit comprises:

a node name giving unit which gives a node name to a power supply line and a ground line in the circuit connection information stored in said first circuit connection information storing unit;

a circuit connection information tree generating unit which generates a circuit connection information tree using the power supply line to which the node name is given as a start point and indicative of a connection relation of P-type transistor devices and a connection relation of resistive elements, and generates a circuit connection information tree using the ground line to which the node name is given as a start point and indicative of a connection relation of N-type transistor devices and a connection relation of resistive elements;

a grouping unit which groups devices of the same kind at the same level in each of said circuit connection information trees generated;

a group dividing unit which divides a group by selecting devices connected to the same line, other than the power supply line, or selecting devices connected to the same line, other than the ground line, from the devices in each of groups formed by said grouping unit;

a branch device grouping unit for, when a branch extending from the power supply line to the ground line and a branch extending from the ground line to the power supply line exist in the circuit connection information trees generated, grouping all devices of the same kind existing in each of the branches;

a group coupling unit which couples groups sharing a device in groups formed by said group dividing unit and groups formed by said branch device grouping unit;

a design constraint adding unit which adds the groups formed by said group dividing unit and the groups formed by said branch device grouping unit, as pairing constraints, to said circuit connection information; and an editing unit which edits the device pairing constraint added by said design constraint adding unit and writes the device pairing constraints after editing into said second circuit connection information storing unit.

7. The analog cell layout designing apparatus according to claim 6, wherein said design constraint predicting and extracting unit further comprises a circuit connection information rewriting unit which rewrites circuit connection information of each of the resistive elements, other than the resistive element having the lowest resistance, to information of serial connection of the resistive elements, each having the lowest resistance in a group of the resistive elements in the groups coupled by said group coupling unit, wherein said design constraint adding unit adds the device pairing constraint to the circuit connection information, including the circuit connection information rewritten by said circuit connection information rewriting unit.

8. The analog cell layout designing apparatus according to claim 6, wherein said design constraint predicting and extracting unit further comprises a circuit connection information rewriting unit which rewrites circuit connection information of each of bipolar transistor devices, other than a bipolar transistor device having the smallest emitter size in a group of bipolar transistor devices in the groups formed by said group coupling unit, to information of parallel connection of the bipolar transistor devices each having the smallest emitter size, and said design constraint adding unit adds the device pairing constraint to the circuit connection information, including the circuit connection information rewritten by said circuit connection information rewriting unit.

9. The analog cell layout designing apparatus according to claim 6, wherein said design constraint predicting and extracting unit further comprises a circuit connection information rewriting unit, and said circuit connection information rewriting unit performs at least one of, rewriting of circuit connection information of each of MOS transistors, other than an MOS transistor device having the smallest gate width, to information of parallel connection of MOS transistor devices, each having the smallest gate width, when gate lengths of the MOS transistor devices are equal to each other, in a group of the MOS transistor devices in the groups formed by said group coupling unit; and rewriting of circuit connection information of each of the MOS transistors, other than the MOS transistor device having the smallest gate length, to information of serial connection of MOS transistor devices each having the smallest gate length when gate widths of the MOS transistor devices are equal to each other, wherein said design constraint adding unit adds said device pairing constraint to the circuit connection information, including the circuit connection information rewritten by said circuit connection information rewriting unit.

10. An analog cell layout designing method comprising:

a circuit diagram generating step of generating an analog circuit diagram;

a circuit diagram data storing step of storing circuit diagram data corresponding to the analog circuit diagram generated in the circuit diagram generating step;

a circuit connection information extracting step of extracting circuit connection information from the stored analog circuit diagram data;

a first circuit connection information storing step of storing the circuit connection information extracted in the circuit connection information extracting step;

a design constraint predicting and extracting step of predicting and extracting devices to be paired from the stored circuit connection information and adding the devices extracted as design constraints to the circuit connection information;

a second circuit connection information storing step of storing the circuit connection information to which the design constraints are added in the design constraint predicting and extracting step;

an automatic placing step of placing layout cells selected based on the stored circuit connection information including the design constraints in accordance with a process design rule; and an automatic routing step of conducting routing of the layout cells placed in the automatic placing step in accordance with the process design rule.

11. The analog cell layout designing method according to claim 10, wherein the design constraint predicting and extracting step comprises:

a node name giving step of giving a node name to a power supply line and a ground line in the stored circuit connection information stored;

a circuit connection information tree generating step of generating a circuit connection information tree using the power supply line to which the node name is given as a start point and indicative of a connection relation of P-type transistor devices and a connection relation of resistive elements, and generating a circuit connection tree using the ground line to which the node name is given as a start point and indicative of a connection relation of N-type transistor devices and a connection relation of resistive elements;

a grouping step of grouping devices of the same kind at the same level in each of the circuit connection information trees generated;

a group dividing step of dividing a group by selecting devices connected to the same line, other than the power supply line, or selecting devices connected to the same line, other than the ground line, from the devices in each of groups formed in the grouping step;

a group coupling step of coupling groups sharing a device in the groups formed in the group dividing step;

a design constraint adding step of adding the groups formed in the group dividing step, as a pairing constraint to the circuit connection information; and an editing step of editing the device pairing constraint added in the design constraint adding step and storing the result of addition.

12. The analog cell layout designing method according to claim 11, wherein the design constraint predicting and extracting step further comprises a circuit connection information rewriting step of rewriting circuit connection information of each of the resistive elements, other than the resistive element having the lowest resistance, to information of serial connection of resistive elements each having the lowest resistance in a resistive element group in the groups formed in the group coupling step, wherein the design constraint adding step adds the device pairing constraint to the circuit connection information, including the circuit connection information rewritten in the circuit connection information rewriting step.

13. The analog cell layout designing method according to claim 11, wherein the design constraint predicting and extracting step further comprises a circuit connection information rewriting step of rewriting circuit connection information of each of bipolar transistor devices, other than a bipolar transistor device having the smallest emitter size, in a group of bipolar transistor devices in the groups formed in the group coupling step to information of parallel connection of the bipolar transistor devices, each having the smallest emitter size, wherein the design constraint adding step adds the device pairing constraint to the circuit connection information, including the circuit connection information rewritten in the circuit connection information rewriting step.

14. The analog cell layout designing step according to claim 11, wherein the design constraint predicting and extracting step further comprises a circuit connection information rewriting step of performing at least one of rewriting of circuit connection information of each of MOS transistors, other than an MOS transistor device having the smallest gate width, to information of parallel connection of MOS transistor devices, each having the smallest gate width when gate lengths of the MOS transistor devices are equal to each other, in an MOS transistor device group in the groups formed in the group coupling step; and rewriting of circuit connection information of each of MOS transistors, other than an MOS transistor device having the smallest gate length, to information of serial connection of MOS transistor devices, each having the smallest gate length when gate widths of the MOS transistor devices are equal to each other, wherein the design constraint adding step adds the device pairing constraint to the circuit connection information, including the circuit connection information rewritten in the circuit connection information rewriting step.

15. The analog cell layout designing method according to claim 10, wherein the design constraint predicting and extracting step comprises:

a node name giving step of giving a node name to a power supply line and a ground line in the stored circuit connection information;

a circuit connection information tree generating step of generating a circuit connection information tree using the power supply line to which the node name is given as a start point and indicative of a connection relation of P-type transistor devices and a connection relation of resistive elements, and generating a circuit connection tree using the ground line to which the node name is given as a start point and indicative of a connection relation of N-type transistor devices and a connection relation of resistive elements;

a grouping step of grouping devices of the same kind at the same level in each of the circuit connection information trees generated;

a group dividing step of dividing a group by selecting devices connected to the same line, other than the power supply line, or selecting devices connected to the same line, other than the ground line, from the devices in each of groups formed in the grouping step;

a branch device grouping step, when a branch extending from the power supply line to the ground line and a branch extending from the ground line to the power supply line exist in each of the circuit connection information trees generated, of grouping all the devices of the same kind existing in each of the branches;

a group coupling step of coupling groups sharing a device in groups formed in the group dividing step and groups formed in the branch device grouping step;

a design constraint adding step of adding each of the groups formed in the group dividing step and the groups formed in the branch device grouping step as a device pairing constraint to the circuit connection information; and an editing step of editing the device pairing constraint added in the design constraint adding step and storing the result of addition.

16. The analog cell layout designing method according to claim 15, wherein the design constraint predicting and extracting step further comprises a circuit connection information rewriting step of rewriting circuit connection information of each of the resistive elements, other than the resistive element having the lowest resistance, to information of serial connection of resistive elements each having the lowest resistance in a resistive element group in the groups formed in the group coupling step, wherein the design constraint adding step adds the device pairing constraint to the circuit connection information, including the circuit connection information rewritten in the circuit connection information rewriting step.

17. The analog cell layout designing method according to claim 15, wherein the design constraint predicting and extracting step further comprises a circuit connection information rewriting step of rewriting circuit connection information of each of bipolar transistor devices, other than a bipolar transistor device having the smallest emitter size, in a group of bipolar transistor devices in the groups formed in the group coupling step to information of parallel connection of the bipolar transistor devices, each having the smallest emitter size, wherein the design constraint adding step adds the device pairing constraint to the circuit connection information, including the circuit connection information rewritten in the circuit connection information rewriting step.

18. The analog cell layout designing step according to claim 15, wherein the design constraint predicting and extracting step further comprises a circuit connection information rewriting step of performing at least one of rewriting of circuit connection information of each of MOS transistors, other than an MOS transistor device having the smallest gate width, to information of parallel connection of MOS transistor devices, each having the smallest gate width when gate lengths of the MOS transistor devices are equal to each other, in an MOS transistor device group in the groups formed in the group coupling step; and rewriting of circuit connection information of each of MOS transistors, other than an MOS transistor device having the smallest gate length, to information of serial connection of MOS transistor devices, each having the smallest gate length when gate widths of the MOS transistor devices are equal to each other, wherein the design constraint adding step adds the device pairing constraint to the circuit connection information, including the circuit connection information rewritten in the circuit connection information rewriting step.

19. A computer program for causing a computer to perform:

a circuit diagram generating step of generating an analog circuit diagram;

a circuit diagram data storing step of storing circuit diagram data corresponding to the analog circuit diagram generated in the circuit diagram generating step;

a circuit connection information extracting step of extracting circuit connection information from the stored analog circuit diagram data;

a first circuit connection information storing step of storing the circuit connection information extracted in the circuit connection information extracting step;

a design constraint predicting and extracting step of predicting and extracting devices to be paired from the stored circuit connection information and adding the devices extracted as design constraints to the circuit connection information;

a second circuit connection information storing step of storing the circuit connection information to which the design constraints are added in the design constraint predicting and extracting step;

an automatic placing step of placing layout cells selected on the basis of the stored circuit connection information including the design constraints in accordance with a process design rule; and an automatic routing step of conducting routing of the layout cells placed in the automatic placing step in accordance with the process design rule.

* * * * *